(12) United States Patent
Pelella

(10) Patent No.: US 10,454,477 B1
(45) Date of Patent: Oct. 22, 2019

(54) DYNAMIC DECODE CIRCUIT LOW POWER APPLICATION

(71) Applicant: International Business Machines Corporation, Armonk, NY (US)

(72) Inventor: Antonio Raffaele Pelella, High Falls, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/416,250

(22) Filed: May 19, 2019

Related U.S. Application Data

(63) Continuation of application No. 16/101,488, filed on Aug. 12, 2018.

(51) Int. Cl.
 *G05F 1/10* (2006.01)
 *H03K 19/00* (2006.01)
 *H03K 19/094* (2006.01)
 *H03M 13/37* (2006.01)

(52) U.S. Cl.
 CPC ..... *H03K 19/0016* (2013.01); *H03K 19/0002* (2013.01); *H03K 19/094* (2013.01); *H03M 13/3707* (2013.01)

(58) Field of Classification Search
 None
 See application file for complete search history.

(56) References Cited

U.S. PATENT DOCUMENTS

| | | | |
|---|---|---|---|
| 4,086,500 A | 4/1978 | Suzuki et al. | |
| 5,263,173 A | 11/1993 | Gleason | |
| 5,291,076 A | 3/1994 | Bridges et al. | |
| 5,737,279 A | 4/1998 | Carter | |
| 5,764,589 A | 6/1998 | Lotfi | |
| 5,825,208 A | 10/1998 | Levy et al. | |
| 6,002,292 A * | 12/1999 | Allen | H03K 19/0963 326/16 |
| 6,172,531 B1 | 1/2001 | Alpperspach | |
| 6,265,899 B1 | 7/2001 | Abdel-Hafeez et al. | |
| 6,331,791 B1 | 12/2001 | Huang | |
| 6,345,381 B1 | 2/2002 | Leight et al. | |
| 6,407,585 B1 | 2/2002 | Vinh | |
| 6,367,065 B1 | 4/2002 | Leight et al. | |

(Continued)

FOREIGN PATENT DOCUMENTS

EP 1887699 A2 2/2008

OTHER PUBLICATIONS

Preliminary Amendment Title "List of IBM Patents or Applications Treated as Related-IV" 2 pages Filed May 19, 2019.

(Continued)

*Primary Examiner* — Lincoln D Donovan
*Assistant Examiner* — Khareem E Almo
(74) *Attorney, Agent, or Firm* — John E. Campbell; Margaret A. McNamara

(57) ABSTRACT

A dynamic decode circuit for decoding a plurality of input signals to produce a positive output pulse one gate delay following a clock signal, wherein the output pulse indicates the plurality of signals were in a predetermined state, wherein the output pulse is active during an evaluation phase of a clock cycle and not active during a precharge phase of the clock cycle, wherein precharge is performed by nfet transistors.

20 Claims, 18 Drawing Sheets

(56) References Cited

U.S. PATENT DOCUMENTS

| | | |
|---|---|---|
| 6,377,080 B1 | 4/2002 | Arnold |
| 6,614,268 B2 | 9/2003 | Dally et al. |
| 6,621,305 B2 | 9/2003 | Nakagawa et al. |
| 6,911,846 B1 | 6/2005 | Blomgren |
| 6,946,877 B2 | 9/2005 | Patella et al. |
| 7,034,576 B2 * | 4/2006 | Levy ................ H03K 19/0963 326/95 |
| 7,095,252 B2 | 8/2006 | Haase et al. |
| 7,109,757 B2 | 9/2006 | Yuan et al. |
| 7,126,408 B2 | 10/2006 | Zerbe et al. |
| 7,164,302 B1 * | 1/2007 | Elkin .................... H03K 3/012 327/208 |
| 7,176,725 B2 | 2/2007 | Dawson et al. |
| 7,332,937 B2 | 2/2008 | Hsu et al. |
| 7,349,288 B1 | 3/2008 | Montoya et al. |
| 7,372,303 B2 | 5/2008 | Akiyoshi |
| 7,429,880 B2 | 9/2008 | Rana et al. |
| 7,541,841 B2 | 6/2009 | Sumita |
| 7,639,057 B1 * | 12/2009 | Su ............................ G06F 1/10 326/93 |
| 7,639,545 B2 | 12/2009 | Morein |
| 7,683,672 B2 | 3/2010 | Bartlett |
| 7,902,878 B2 | 3/2011 | Saint-Laurent et al. |
| 7,936,185 B1 * | 5/2011 | Weigl ................ H03K 19/0966 326/95 |
| 7,940,087 B1 * | 5/2011 | Weigl ................ H03K 19/0966 326/95 |
| 8,063,673 B2 * | 11/2011 | Masleid ................ H03K 3/012 327/112 |
| 8,072,252 B2 | 12/2011 | Bailey |
| 8,164,972 B1 | 4/2012 | Su |
| 8,339,884 B2 | 12/2012 | Huang et al. |
| 8,487,657 B1 | 7/2013 | Hoekstra et al. |
| 8,493,093 B1 | 7/2013 | Chang et al. |
| 8,552,761 B2 * | 10/2013 | Kim ...................... H04L 25/028 326/93 |
| 8,860,463 B1 * | 10/2014 | Qureshi ......... H03K 19/017581 326/121 |
| 8,860,464 B2 | 10/2014 | Gupta et al. |
| 8,861,302 B2 | 10/2014 | Terzioglu et al. |
| 8,890,573 B2 | 11/2014 | Elkin et al. |
| 8,958,264 B2 | 2/2015 | Koike et al. |
| 9,036,447 B2 | 5/2015 | Masleid et al. |
| 9,742,408 B1 * | 8/2017 | Bunce ................ H03K 19/0963 |
| 9,876,503 B2 | 1/2018 | Vrudhula et al. |
| 2005/0040861 A1 | 2/2005 | Haase |
| 2005/0110522 A1 | 5/2005 | Hoekstra |
| 2006/0082388 A1 * | 4/2006 | Bjorksten .......... H03K 19/0963 326/95 |
| 2006/0176081 A1 | 8/2006 | Dawson et al. |
| 2006/0176757 A1 | 8/2006 | Chan et al. |
| 2006/0290383 A1 * | 12/2006 | Chuang .............. H03K 19/0963 326/97 |
| 2006/0290384 A1 * | 12/2006 | Chuang .............. H03K 19/0963 326/97 |
| 2007/0176641 A1 * | 8/2007 | Kursun .............. H03K 19/0966 326/97 |
| 2007/0176642 A1 * | 8/2007 | Kursun .............. H03K 19/0966 326/98 |
| 2008/0084235 A1 * | 4/2008 | Russell ........... H03K 3/356156 327/218 |
| 2008/0143412 A1 * | 6/2008 | Sumita ............... H03K 3/35625 327/200 |
| 2008/0258788 A1 * | 10/2008 | Bhatia ............. H03K 3/356121 327/201 |
| 2009/0230994 A1 * | 9/2009 | Rhee .................. H03K 19/0963 326/98 |
| 2012/0146697 A1 * | 6/2012 | Leach .................... H03K 3/012 327/202 |
| 2012/0182056 A1 * | 7/2012 | Dally ..................... H03K 3/012 327/202 |
| 2015/0091629 A1 * | 4/2015 | Ishizu .................... G11C 5/145 327/306 |
| 2016/0307621 A1 * | 10/2016 | Campbell .............. G11C 5/143 |
| 2018/0091153 A1 | 3/2018 | Bunce et al. |

OTHER PUBLICATIONS

Turi et al.; "Low-Power FinFET Design Schemes for NOR Address Decoders", VLSI Design Automation and Test (VLSI-DAT), 2010 IEEE International Conference On, Apr. 26-19, 2010, pp. 74-77.

Thorp et al.; "Analysis of Blocking Dynamic Circuits", Very Large Scale Integration (VLSI) Systems, IEEE Transaction On, vol. 11, Issue 4, Aug. 2003, pp. 744-748.

Mane et al.; "Stateful-NOR Based Reconfigurable Architecture for Logic Implementation", Microelectronics Journal, vol. 46, Issue 6, Jun. 2015, pp. 551-562.

* cited by examiner

DYNAMIC DECODE CIRCUIT LOW POWER APPLICATION

FIELD OF THE INVENTION

The present invention is related to computer systems and more particularly to controlling glitches in a decode circuit implemented in dynamic logic.

BACKGROUND

SRAM (static Random Access Memory) can be limited by the performance of its address decoders. In certain SRAM designs, as soon as a particular row of cells may be selected by the corresponding word line going high, the bit lines begin to develop a voltage based on the contents of the memory cells. The sooner the word line goes high, the better the read performance of the SRAM. Hence, speed up in the operation of the address decoders results in a better performance of the memory array.

CMOS logic may be often implemented in dynamic logic where circuits may be precharged in a precharge phase of clocking, and evaluated in an evaluate stage of the clocking.

Dynamic decode circuits may be synchronous logic circuits that generate an output depending upon a predetermined combination of inputs. Precharge devices may be characterized by two states, precharge and evaluate. In the precharge state, a node may be charged to a known or predetermined voltage level, for example high (near VDD). In the evaluate state, an array or "tree" of transistors may be given the opportunity to either discharge the node to a second known or predetermined voltage level, for example low (near VSS) or to allow the charge to persist. Each input signal may be connected, typically, to a gate of one or more of the transistors in the tree. The final charge on the output node may thereby be controlled by the particular values of the inputs and the way in which the transistors may be connected within the tree. The final voltage at the node, high or low, acts as the output of the dynamic decode circuits after being suitably buffered and, perhaps, inverted. The two states of a precharge device each correspond to one of the two logic states of a clock signal cycle to which the precharge device may be synchronized. Typically, a pfet precharge device precharges the node when the clock is low and evaluates the node when the clock is high.

Two common uses for precharge devices may be as decoders and as comparators. Decoders output a unique signal if and only if all of the bits of an input match a predetermined set of values. A decoder may thereby enable a particular write line in a matrix of memory cells if and only if an input memory address matches the predetermined address of a line of memory cells to which the decoder may be connected. Similarly, a comparator will output a unique signal if and only if two inputs, each containing multiple data bits, may be identical.

The particular way the inputs may be combined within the tree of a dynamic decode circuit determines the particular operating characteristics (function) and, hence, the particular name of the node. As described above, if the tree discharges the charged node if and only if the input bits match a single set of predetermined values, then the a dynamic decode circuit may be a decoder. Any Boolean function can be implemented as a dynamic decode circuit by constructing the tree such that the tree causes the precharge device to discharge when the Boolean function may be either true or false, as needed by the designer. Logically, it may be irrelevant whether a tree allows the charge in a dynamic decode circuit to persist when the Boolean function is true or to persist when the function is false.

Each dynamic decode circuit can be implemented in one of two logically equivalent ways. The two implementations correspond to a tree that discharges the charged node when the Boolean function is true and to a tree that discharges the charged node when the Boolean function is false. When a dynamic decode circuit discharges the node if the Boolean function is true, it may be said to "evaluate to the active state." When the precharge device discharges the node if the Boolean function is false, it may be said to "evaluate to the inactive state." One of these implementations uses its inputs directly connected in a manner to describe a particular function. The second implementation uses the complements of the inputs and a second function. DeMorgan's law allows the designer to restructure the tree of the first function to produce a tree for the second function. The second function may be the first function's complement.

Although logically equivalent, each of the two possible implementations of a dynamic decode circuit has its own disadvantage. Specifically, the more transistors connected in series within the tree, the slower the performance of the dynamic decode circuit. This disadvantage may be typically associated with a dynamic decode circuit that discharges the charged node when its function is true. Conversely, a dynamic decode circuit that evaluates to the inactive state generates an output unacceptable to many types of circuits. This disadvantage may be typically associated with a dynamic decode circuit that discharges the charged node when its function is false.

SUMMARY

The shortcomings of the prior art may be overcome and additional advantages may be provided through the provision of a dynamic decode circuit for low power applications. Each cycle of a dynamic decode circuit consists of a precharge phase followed by an evaluate phase. Preferably, the dynamic decode circuit may decode a plurality of input signals to produce a positive pulse based on an evaluate clock being active, the pulse indicating that the inputs in a predetermined state.

The dynamic decode circuit preferably comprise a decoder stage and an evaluate stage. The decoder stage of dynamic logic having nfet transistors for causing a first node (NODE 1) to be low during the precharge phase of a cycle, the decoder causing the first node to be low only when the inputs are in the predetermined state (TRUE) during the evaluate phase of the cycle, the decoder stage causing the first node to be high when the inputs are not in the predetermined state during the evaluate phase.

The evaluate stage, creates a positive output pulse on a second node (OUT) based on the first node. The output pulse being positive only during the evaluate phase of a cycle having inputs in the predetermined state. The evaluate stage creates no positive output pulse in a cycle not having inputs in the predetermined state Preferably the output pulse is generated within only one gate delay of a clock (CLK).

In an embodiment a dynamic logic circuit comprises a dynamic decode logic circuit comprising one or more nfet precharge circuits connected to a first power source, wherein each of the nfet precharge circuits comprises a first nfet precharge transistor having a first nfet precharge gate configured to receive a negative active evaluation clock signal, wherein the negative active negative active evaluation clock signal is configured to be low during an evaluation phase;

the dynamic decode logic circuit comprising one or more pfet evaluate transistors connected to a second power source, wherein each of the pfet evaluate transistors has a first pfet evaluation gate configured to receive the negative active evaluation clock signal; the dynamic decode logic circuit comprising a decoder, wherein the decoder is configured to decode a plurality of inputs to pull a first node to a low state based on the plurality of inputs being in a predetermined state, wherein the decoder is configured to not pull the first node to the low state based on the plurality of inputs not being in the predetermined state; the dynamic decode logic circuit comprising an evaluation circuit, the evaluation circuit consisting of a first nfet transistor serially connected to a first pfet transistor by a second node, wherein the first pfet transistor comprises a first pfet gate conductively connected to the first node, wherein the first nfet transistor comprises a first nfet gate conductively connected to the first node, wherein the first pfet transistor is connected to a pfet evaluate transistor by a pfet share (PSHARE) node, wherein a first nfet precharge circuit is configured to precharge the first node to the low state during a precharge phase of the negative active evaluation clock signal; and the dynamic decode logic circuit comprising a third node of the decoder conductively connected to a pfet evaluate transistor.

In an embodiment, the decoder comprises a plurality of pfet decoder transistors connected in parallel between the first node and the third node, wherein each of the plurality of pfet decoder transistors has a respective gate connected to a respective input.

In an embodiment, the dynamic decode logic circuit further comprises a plurality of serially connected nfet transistors, wherein the plurality of serially connected nfet transistors are disposed between the first power source and the first node, wherein each of the serially connected nfet transistors comprises a respective gate configured to receive a respective input signal from a respective input.

In an embodiment, the dynamic decode logic circuit further comprises a pfet keeper transistor connected between the first node and the second power source, wherein the second node is conductively connected to a keeper gate of the pfet keeper transistor.

In an embodiment first nfet transistor is directly connected to the second power source.

In an embodiment at least one of the plurality of nfet precharge circuits consists of two serially connected nfet transistors consisting of the first nfet precharge transistor and a second nfet precharge transistor, wherein a second nfet precharge gate of the second nfet precharge transistor is configured to receive a delayed clock signal, wherein the delayed clock signal is a delayed version of the negative active evaluation clock signal.

In an embodiment the dynamic decode circuit is configured to cause the second node to be high based on all the inputs being high and the negative active evaluation clock signal being low.

In an embodiment a second nfet precharge circuit is configured to precharge the second node during the precharge phase of the negative active evaluation clock signal.

In an embodiment a third nfet precharge circuit is configured to precharge the second node during the precharge phase of the negative active evaluation clock signal, wherein a fourth nfet precharge circuit is configured to precharge the PSHARE node during the precharge phase of the negative active evaluation clock signal.

In an embodiment the PSHARE node is configured to be conductively connected to PSHARE nodes of one or more other dynamic decode circuits, wherein the pfet evaluate transistor connected to the first pfet transistor of each dynamic decode circuit is a small pfet transistor, the small pfet transistor providing only a portion of current required to pull the PSHARE node of a plurality of dynamic decode circuits to a high state.

In an embodiment the dynamic decode circuit is configured to produce a positive pulse on the second node based on the predetermined state being all inputs being in the high state, wherein start of the positive pulse is based on start of the evaluation phase, and end of the positive pulse is based on start of the precharge phase.

In an embodiment the dynamic logic circuit further comprises a clock inverter, wherein the clock inverter creates the negative active evaluation clock signal from a positive active evaluation clock signal, wherein the positive active evaluation clock signal is configured to be high during an evaluation phase.

In an embodiment the dynamic decode logic circuit is one of a plurality of dynamic decode logic circuits, wherein the clock inverter is configured to send the negative active evaluation clock signal to each dynamic decode logic circuit of the plurality of dynamic decode logic circuits.

In an embodiment the dynamic decode logic circuit further comprises a pfet precharged logic circuit, the pfet precharged logic circuit comprising: one or more pfet precharge circuits connected to the second power source, wherein each of the pfet precharge circuits comprises a respective first pfet precharge transistor having a first pfet precharge gate configured to receive the positive active evaluation clock signal; and one or more nfet evaluate transistors connected to the first power source, wherein each of the nfet evaluate transistors has a respective first nfet evaluation gate configured to receive the positive active evaluation clock signal.

In an embodiment the dynamic decode logic circuit further comprises a local clock buffer, the local clock buffer configured to create the positive active evaluation clock signal from a system clock signal.

In an embodiment the dynamic decode logic circuit further comprises a clock inverter and a plurality of delay clock inverters, wherein the clock inverter creates the negative active evaluation clock signal from a positive active evaluation clock signal, wherein the plurality of delay clock inverters create the delayed clock signal from the negative active evaluation clock signal of the clock inverter.

In an embodiment the dynamic decode logic circuit is one of a plurality of dynamic decode logic circuits, wherein the clock inverter is configured to send the negative active evaluation clock signal to each dynamic decode logic circuit of the plurality of dynamic decode logic circuits.

In an embodiment the dynamic decode logic circuit further comprises a pfet precharged logic circuit, the pfet precharged logic circuit comprising: one or more pfet precharge circuits connected to the second power source, wherein each of the pfet precharge circuits comprises a first pfet precharge transistor having a first pfet precharge gate configured to receive the positive active evaluation clock signal; and one or more nfet evaluate transistors connected to the first power source, wherein each of the nfet evaluate transistors has a first nfet evaluation gate configured to receive the positive active evaluation clock signal.

In an embodiment the pfet evaluate transistor connected to the first pfet transistor is the pfet evaluate transistor connected to the PSHARE node.

Referring to FIG. 15, in another embodiment, a method is provided for decoding a plurality of inputs B0 B1 B2 B3 of a dynamic decode logic circuit 1500 of a dynamic logic circuit to produce an output OUT, wherein the dynamic decode logic circuit 1500 comprises a decoder 1505 1506 1507 1508 connected by a first node NODE 1 to an evaluation circuit 1520, wherein the evaluation circuit 1520 is connected to a second node (OUT), wherein the dynamic decode logic circuit 1500 utilizes a negative active evaluation clock signal CLK, wherein the negative active evaluation clock signal CLK is high during a precharge phase 1519, wherein the negative active evaluation clock signal is low during an evaluate phase 1519, the method comprising:

receiving the negative active evaluation clock signal CLK, by a first nfet precharge circuit 1510 1511 connected between a first power source VSS and the first node NODE 1 of the decoder 1505 1506 1507 1508;

receiving the negative active evaluation clock signal CLK, by a first pfet evaluate transistor 1509 connected between a second power source VDD and a third node NODE 3 of the decoder;

precharging one or more nodes of the dynamic decode logic circuit 1500, the precharging comprising precharging the first node NODE 1 low, by the first nfet precharge circuit 1510 1511, based on the received negative active evaluation clock signal CLK being high;

causing the third node NODE 3 to be high, by the first pfet evaluate transistor 1509, based on the received negative active evaluation clock signal CLK being low;

decoding the plurality of inputs B0 B1 B2 B3, by the decoder 1505 1506 1507 1508, the decoding comprising based on the third node NODE 3 being high and the plurality of inputs not being in the predetermined state, causing, by the decoder 1505 1506 1507 1508, the first node NODE 1 to be high; and performing, by dynamic decode logic circuit 1500, any one of:
 based on the first node NODE 1 being high, causing the second node NODE 2 to be low, by the evaluation circuit 1520, during the evaluation phase; and
 based on the first node NODE 1 being low and, causing, the second node NODE 2 to be high, by the evaluation circuit 1520, during the evaluation phase.

In an embodiment, the decoding further comprises, based on the third node NODE 3 being high and the plurality of inputs B0 B1 B2 B3 being in the predetermined state, not causing, by the decoder 1505 1506 1507 1508, the first node NODE 1 to be high.

In an embodiment, all of the plurality of inputs B0 B1 B2 B3 being high is the predetermined state.

In an embodiment, the method further comprises pulling the first node NODE 1 low, by a series of nfet transistors 1501 1502 1503 1504, based on the inputs being in the predetermined state.

Referring to FIG. 18, in an embodiment, the method further comprises pulling the first node low, by a pfet keeper transistor 1801 (FIG. 18), based on the second node NODE 2 being high.

Referring to FIG. 23 and FIG. 15, in an embodiment, the method further comprises:

creating 2301 2302 a delayed clock signal DCLK, wherein the delayed clock signal DCLK is a delayed version of the negative active evaluation clock signal CLK; and precharging the one or more nodes NODE 1 NODE 2 NODE 3 based on the negative active evaluation clock signal CLK being high and the delayed clock signal DCLK being high 1510 1511 (FIG. 15).

In an embodiment, the method further comprises causing the second node NODE 2 to be low, by a second nfet precharge circuit 1517 1518, based on a received negative active evaluation clock signal CLK being high.

In an embodiment, the method further comprises: causing the second node NODE 2 to be low, by a second nfet precharge circuit 1517 1518, based on the negative active evaluation clock signal CLK being high; and causing an interconnection (PSHARE) node between the evaluation circuit 1520 and a pfet evaluate transistor 1514 to be low, by a third nfet precharge circuit 1512 1513, based on the negative active evaluation clock signal CLK being high.

In an embodiment, the method further comprises providing, by an evaluate transistor 1514, only a portion of current required to pull an interconnection (PSHARE) node between the evaluation circuit 1520 and a pfet evaluate transistor 1514 high.

In an embodiment, the method further comprises producing, by the dynamic decode circuit 1500, a positive pulse on the second node NODE 2 based on the predetermined state being all inputs B0 B1 B2 B3 being in the high state, wherein start of the positive pulse is based on start of the evaluation phase, and end of the positive pulse is based on start of the precharge phase.

Referring to FIG. 19 and FIG. 23, in an embodiment, the method further comprises creating, by a clock inverter 1910, the negative active evaluation clock signal CLK from a positive active evaluation clock signal LCLK, wherein the positive active evaluation clock signal LCLK is configured to be high during the evaluation phase, wherein the positive active evaluation clock signal LCLK is configured to be low during the precharge phase.

In an embodiment, referring to FIG. 24 and FIG. 19, the method further comprises sending, by the clock inverter 1910, the negative active evaluation clock signal CLK to each dynamic decode logic circuit of a plurality of dynamic decode logic circuits 2401 2402 of the dynamic logic circuit.

Referring to FIG. 19 and FIG. 2, in an embodiment, the method further comprises:
receiving the positive active evaluation clock signal LCLK, by one or more pfet precharged logic circuits 1902, each pfet precharged logic circuit comprising one or more pfet precharge circuits 1904 (FIG. 19) 104 (FIG. 2) connected to the second power source; and
receiving the positive active evaluation clock signal LCLK, by each first nfet evaluate transistor 219 213 FIG. 2 of the one or more pfet precharged logic circuits 1902.

In an embodiment, the method further comprises creating by a local clock buffer 1901 of the dynamic logic circuit, the positive active evaluation clock LCLK signal from a system clock signal.

In an embodiment, the method further comprises receiving, by each decoder transistor 1505 1506 1507 1508 of the decoder, a respective input B0 B1 B2 B3 of the plurality of inputs, wherein each decoder transistor 1505 1506 1507 1508 is connected between the first node NODE 1 and the third node NODE 3.

Referring to FIG. 23, in an embodiment, the method further comprises:

creating, by a clock inverter 1910, the negative active evaluation clock signal CLK from a positive active evaluation clock signal +LCLK; and creating, by a plurality of delay clock inverters 2301 2302, the delayed clock signal DCLK from the negative active evaluation clock signal CLK of the clock inverter 1910.

In an embodiment, referring to FIG. 24, the method further comprises sending, by the clock inverter 1910, the negative active evaluation clock signal CLK to each dynamic decode logic circuit of a plurality of dynamic decode logic circuits 2401 2402.

In an embodiment, the method further comprises pulling an interconnection (PSHARE) node between the evaluation circuit 1520 and a pfet evaluate transistor 1504 positive, by a second pfet evaluate transistor 1504, based on the negative active evaluation clock signal CLK being low.

In an embodiment, the method further comprises causing the third node NODE 3 to be low, by a third nfet precharge circuit 1510 1511, based on the received negative active evaluation clock signal being high.

In an embodiment, the method further comprises pulling an interconnection (PSHARE) node between the evaluation circuit 1520 and a pfet evaluate transistor 1504 positive, by the first evaluate transistor, based on the negative active evaluation clock signal CLK being low.

Additional features and advantages may be realized through the techniques of the present invention. Other embodiments and aspects of the invention may be described in detail herein and may be considered a part of the claimed invention. For a better understanding of the invention with advantages and features, refer to the description and to the drawings.

BRIEF DESCRIPTION OF THE DRAWINGS

The subject matter which may be regarded as the invention may be particularly pointed out and distinctly claimed in the claims at the conclusion of the specification. The foregoing and other objects, features, and advantages of the invention may be apparent from the following detailed description taken in conjunction with the accompanying drawings in which:

Figure 1:
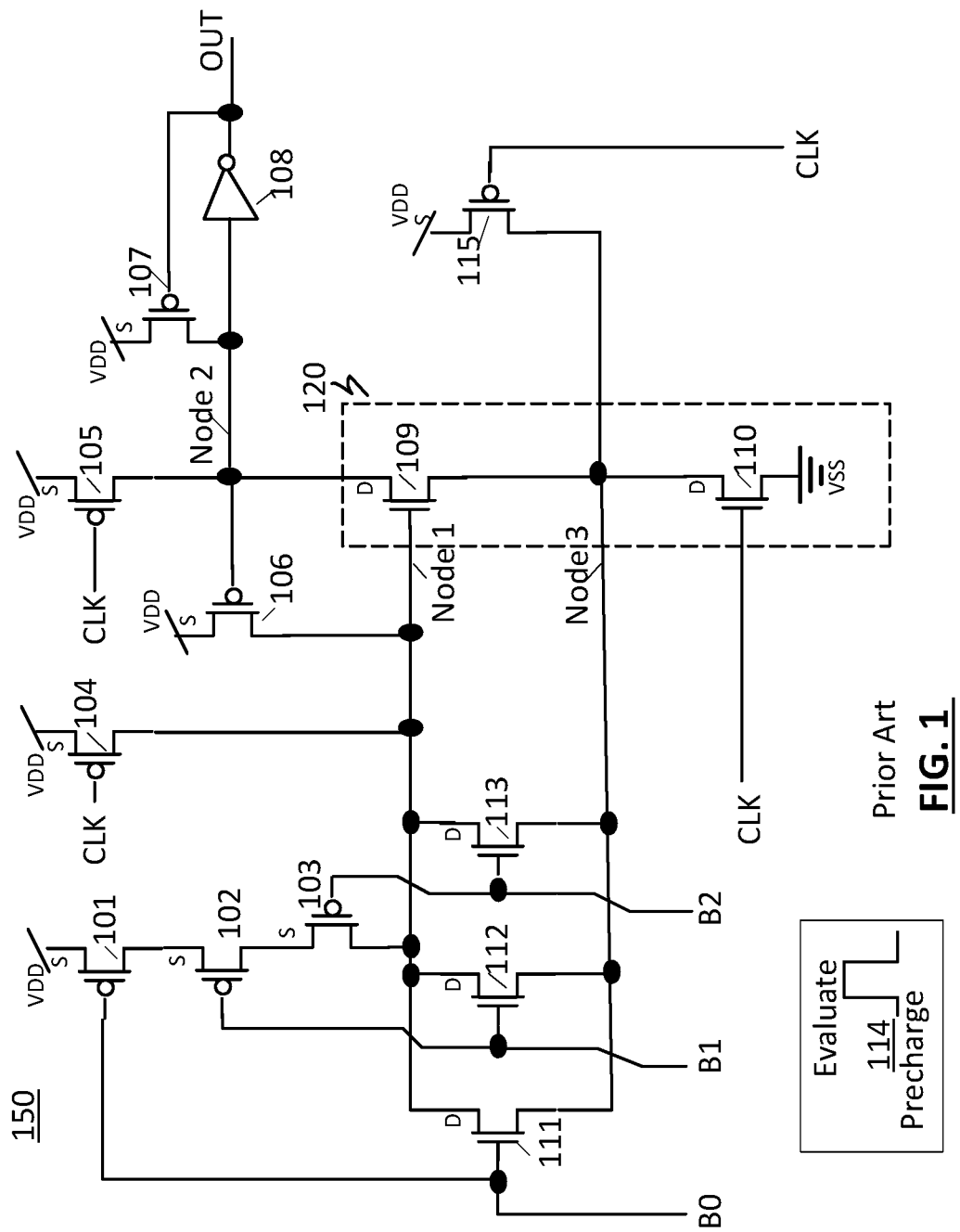
FIG. 1 depicts a prior art example embodiment of a dynamic decode circuit.

The detailed description explains the preferred embodiments of the invention, together with advantages and features, by way of example with reference to the drawings.

DETAILED DESCRIPTION OF EMBODIMENTS

Glossary of Terms

In dynamic logic, a problem arises when cascading one gate to the next. The precharge "1" state of the first gate may cause the second gate to discharge prematurely, before the first gate has reached its correct state. This uses up the "precharge" of the second gate, which cannot be restored until the next clock cycle, so there may be no recovery from this error.

In order to cascade dynamic logic gates, one solution may be Domino Logic, which inserts an ordinary static inverter between stages. While this might seem to defeat the point of dynamic logic, since the inverter has a pfet (one of the main goals of Dynamic Logic may be to avoid pfets where possible, due to speed), there may be two reasons it works well. First, there may be no fan-out to multiple pfets; the dynamic gate connects to exactly one inverter, so the gate may be still very fast. Furthermore, since the inverter connects to only nfets in dynamic logic gates, it too may be very fast. Second, the pfet in an inverter can be made smaller than in some types of logic gates.

In Domino logic cascade structure of several stages, the evaluation of each stage ripples the next stage evaluation, similar to a domino falling one after the other. Once fallen, the node states cannot return to "1" (until the next clock cycle) just as dominos, once fallen, cannot stand up, justifying the name Domino CMOS Logic. It contrasts with other solutions to the cascade problem in which cascading may be interrupted by clocks or other means.

Bulk-CMOS refers to Complementary Metal Oxide Semiconductor and refers to a design and fabrication technology for semiconductors.

SOI (Silicon On Insulator) where Insulator may be Oxide or nitride of Silicon and the like or Sapphire. The SOI field effect transistor n-type (nfet) has a parallel parasitic bipolar NPN transistor associated with it. The drain of the n-type may be equivalent to the collector of the parasitic bipolar transistor. The source of the n-type may be equivalent to the emitter of the parasitic bipolar transistor. The body of the n-type becomes charged by induced leakage whenever the drain and source terminals may be held at a high potential. If the source may be dropped to a low potential the trapped charge in the body causes a current to flow from the base of the parasitic bipolar transistor. This causes a current to flow in the collector that may be parallel to a current flowing in the drain. This action may discharge the drain node of a dynamic circuit and may result in erroneous evaluation. The SOI device may be strained by introducing another material with different atomic size than Silicon e.g. Germanium and the like.

A Metal Oxide Semiconductor (MOS) transistor has two electrodes referred to as the source and the drain and a control electrode as the gate. A transistor has a bulk connection which may be floating e.g. in SOI.

N-type (nfet) may be a Metal Oxide Semiconductor (MOS) transistor with electrons as majority carriers.

P-type (pfet) may be a Metal Oxide Semiconductor (MOS) transistor with holes as majority carriers Primitives may be technology independent logic gates e.g. AND gates, OR gates, NOT etc.

NAND logic gate may be inversion of AND and NOR logic gate may be inversion of OR.

.lib is the Synopsys library format.

Digital design Synthesis may be used to mean the synthesis is of a technology dependent model from a register transfer level description or from interconnected functional blocks to result in standard-cell mapped design from a target library, or result in a combination of standard-cell mapped design from a target library and a transistor level representation for part or all of the input design specification.

Under DeMorgan's theorem, a NAND gate with inverted inputs performs an OR function and a NOR gate with inverted inputs performs an AND function.

A short-circuit occurs when there is a path of zero or almost zero resistance between a first known voltage level and a second known voltage level.

A non-inverting node has no inversion e.g. AND, OR and the like or a combination of these.

An inverting node has inversion e.g. NAND, NOR, NOT and the like or a combination of these.

As used herein, VDD voltage level may be referred to as "high" or "positive", and a VSS voltage level may be referred to as "low" or "negative". A logical "1" may be referred to as "high" or "positive" and a logical "0" may be referred to as "low" or "negative". Pfet transistors conduct when the pfet transistor gate is low and nfet transistors conduct when the nfet transistor gate is high. Low power pfet transistors may be used as "keeper" circuits to hold a node high. These pfet transistors may be too weak to keep a node high if a stronger nfet transistor conducts in series with the pfet, so the nfet will overcome the pfet and pull the node low. However, the keeper circuits may keep the node high if there is only a brief glitch on the node.

Dynamic decode circuits FIG. 1 150, FIG. 2 250 and FIG. 3 350 are characterized as circuits that decode input signals B0 B1 B2 to produce an active output value OUT based on the input signals having a predetermined value. Certain internal nodes NODE 1 NODE 2 and the output OUT are set to an initial value during the precharge phase of the dynamic decode circuit clock CLK, In the example, the dynamic decode circuit is a domino circuit characterized by the inverter 108 resulting in the output OUT being low during the precharge phase (CLK low). Only when the input signals have the predetermined value (all low) during the evaluate phase (CLK high) in the example, will the output value OUT transition to the active value (high).

Embodiments are provided that improve size, performance and stability of dynamic decode circuits. In one embodiment, NODE 3 is precharged to introduce a delay to avoid glitches due to quick transition of NODE 3 relative to NODE 1 as now NODE 3 goes active (low) from VDD rather than a floating gate. The delay introduced nonintuitively, may improve performance of the dynamic decode circuit.

In one embodiment, a delay is introduced between the evaluate phase and the precharge phase which reduces glitches and enables the dynamic decode circuit to keep the output OUT signal active longer.

In this specification, elements included in Figures having the same numeric tag may have substantially the same function.

In an embodiment, nodes of a common dynamic decode circuit (NSHARE, PSHARE) are designed with much smaller clocked transistors, taking advantage of the fact that the dynamic decode circuit is provided in multiple modules of a design, and that only one decode function of all the modules will be selected in any evaluate cycle. Thus these transistors share the current requirement in parallel with each other amongst the multiple modules. This non-intuitive reduction in transistor size may improve performance of the overall implementation.

Referring to FIG. 1, an embodiment of a dynamic decode circuit 150 is shown.

In the embodiment, CLK signal 114 when high may be in an evaluating phase and when low may be in a precharging phase. In an embodiment, the CLK signal may be asymmetrical, i.e. high (active) only for 30% of the CLK signal period for example.

In the precharge phase the evaluation clock signal CLK may be low. The low CLK turns off nfet 110 and turns on pfets 104 105. In turn, pfet 104 precharges internal NODE 1 high and pfet 105 precharges NODE 2 high which forces output OUT low. During the precharge phase the inputs B0 B1 and B2 may change state but NODE 1 will stay high. Due to the nature of dynamic logic, if any of the inputs B0 B1 B2 go positive momentarily in the evaluate stage, NODE 1 may be pulled low and stay low independent of other input changes until the next precharge phase.

The evaluate phase occurs when the CLK signal goes high. This turns off the precharge transistors 104 105 and turns on the evaluate clock transistor 110. If any of the three inputs B0 B1 or B2 are high a path from internal NODE 1 to VSS through 110 may be created and NODE 1 may be pulled low. During the evaluation phase, with NODE 1 low, nfet 109 turns off causing NODE 2 to stay high and the output OUT stays low. If, however, all three inputs are low during the evaluation phase, NODE 1 remains in the high state through the influence of keeper 106. Pfets may be sized to be much weaker than the nfets in the circuit so as to be easily overridden when a node is pulled low.

If any of the inputs B0 B1 B2 go positive momentarily in the evaluate stage, NODE 1 will stay low independent of the inputs until the next precharge phase.

Three pfet series transistors 101 102 103 perform a keeper function on NODE 1. They receive respective input signals B0 B1 and B2 and keep NODE 1 positive after a glitch on NODE 1 if all the inputs are low, independent of CLK.

The name domino comes from the analogy between a sequence of domino logic gates connected in series and a line of domino pieces stood on edge in a row. When the evaluate phase starts a high going output from the first stage can quickly propagate down the chain of dynamic logic discharging internal evaluation nodes like one domino piece knocking down the next piece in the row and so on.

Notice that during the evaluate phase, if NODE 1 is pulled low that it will remain low until the next precharge phase. Therefore it may be important for all inputs to a dynamic gate to remain stable in their intended state while the evaluate signal (CLK) is high. That is in contrast to a static logic gate that imposes no restriction on when inputs may change state. Also notice that the output of a dynamic circuit will always go low during the precharge phase regardless of the state of the inputs.

That means a dynamic gate may undergo switching activity each clock cycle even if the inputs remain unchanged.

For all its complexity and constraints, the dynamic decode circuit in Prior Art FIG. 1 has a number of advantages over its static cousins. First of all, the complementary network of pfets in a static CMOS logic gate has been replaced by a precharge pfet 104 105 and keeper pfet 106 107. The logic function of the gate may be entirely determined by the topology of the nfet pull down network 111 112 113 in the first stage of the domino circuit. This has a profound impact on performance since the complementary pfet network typically represents over half the circuit and roughly ⅔ of the non-interconnect related internal parasitic capacitance. In general, the higher the fan-in (number of inputs) of a logic function the greater the potential performance advantage of a dynamic circuit implementation.

Another advantage of dynamic logic may be that fast logic propagation occurs in only one direction—internal evaluation node falls while the stage output rises. The opposite transition occurs during the precharge phase in parallel across all logic stages and isn't as time critical. This means the transistor size ratios in dynamic circuits can be skewed to increase propagation speed for the active transition. For example, in a domino circuit the WP:WN ratio in the output inverter may be as high as 6:1 in practice. In addition, the input voltage level that a dynamic logic stage switches may be typically lower than for a static logic gate. This may be an advantage in reducing signal propagation times but may be also a disadvantage in that circuits may be much more vulnerable to induced noise on logic signals. Typical design practice may be for signals that travel a long distance (and thus may be more susceptible to noise and ground shift) to be cleaned up by passing through a latch 107 108 (for example) or static logic gate 108 before connecting to the input of another dynamic circuit.

A dynamic decode circuit FIG. 1 may perform the steps of precharging a first and a second node to a first known voltage at a first time and evaluating the voltage on the first node at a second time. The first node and a third node may be coupled to a transistor tree 111 112 113. The tree may be operable to electrically short-circuit the two nodes (NODE 1 NODE 3) responsive to input signals B0 B1 B2. The second node NODE 2 may be coupled to a first current electrode of a screening transistor 109. The screening transistor also has a second current electrode and a control electrode. The control electrode of the screening transistor may be coupled to the first node and the second current electrode of the screening transistor may be coupled to the third node.

In the embodiment, CLK signal 114 when high may be in an evaluating phase and when low may be in a precharging phase. In an embodiment, the CLK signal may be asymmetrical, i.e. high (active) only for 30% of the CLK signal period for example.

The embodiment may include a special precharge circuit 115 for precharging an internal node between serially connected transistors 109 110 of an evaluation circuit 120. The evaluation circuit causing NODE 2 to transition to the inverse of NODE 1 when the evaluation clock CLK goes high. The special precharge circuit 115 is not intuitive since it would appear to introduce an unwanted delay in the dynamic decode circuit 150. However, advantages may outweigh the negatives, for example, in an implementation where a plurality of dynamic decode circuits are provided, the overall performance may improve.

In an embodiment, the evaluation clock CLK provided to the special precharge circuit 115 is the same evaluation CLK provided to the evaluation clock used by evaluation transistors nfet 110.

In an embodiment, the clock CLK provided to the special precharge circuit 115 may be a special evaluation clock SCLK different from the evaluation clock CLK used by evaluation transistors nfet 110 of the dynamic decode circuit. The SCLK may be a delayed version DCLK of the evaluation clock CLK. In an embodiment, the SCLK is high longer than the CLK is high, causing a delay in beginning precharge after the fall of CLK. In an embodiment, a precharge circuit 104 105 other than the special precharge circuit 115, may be provided with the special evaluation clock SCLK. In an embodiment, the circuit 150 employs a serial pair of clocking pfet transistors 218 217 to perform the precharge functions of the special precharge circuit 115. Preferably the precharge phase starts at a predetermined time after the end of the evaluation phase (CLK high). During the predetermined period, the result of the evaluation is maintained. The serial pair includes a respective CLK pfet transistor 218, and a respective DCLK pfet transistor 217. The DCLK may be a delayed version of the evaluation clock CLK. A DCLK signal applied to the DCLK pfet transistor causes the start of the precharge cycle to be delayed.

In the precharge phase the evaluation clock signal CLK may be low. The low CLK turns off nfet 110 and turns on pfets 104 105. In turn, pfet 104 precharges internal NODE 1 high and pfet 105 precharges NODE 2 high which forces output OUT low. During the precharge phase the inputs B0 B1 and B2 may change state but NODE 1 will stay high. Due to the nature of dynamic logic, if any of the inputs B0 B1 B2 go positive momentarily in the evaluate stage, NODE 1 may be pulled low and stay low independent of other input changes until the next precharge phase.

The evaluate phase occurs when the CLK signal goes high. This turns off the precharge transistors 104 105 and turns on the evaluate clock transistor 110. If any of the three inputs B0 B1 or B2 are high a path from internal NODE 1 to VSS through 110 may be created and NODE 1 may be pulled low. During the evaluation phase, with NODE 1 low, nfet 109 turns off causing NODE 2 to stay high and the output OUT stays low. If, however, all three inputs are low during the evaluation phase, NODE 1 remains in the high state through the influence of keeper 106. Pfets may be sized to be much weaker than the nfets in the circuit so as to be easily overridden when a node is pulled low.

Figure 2:
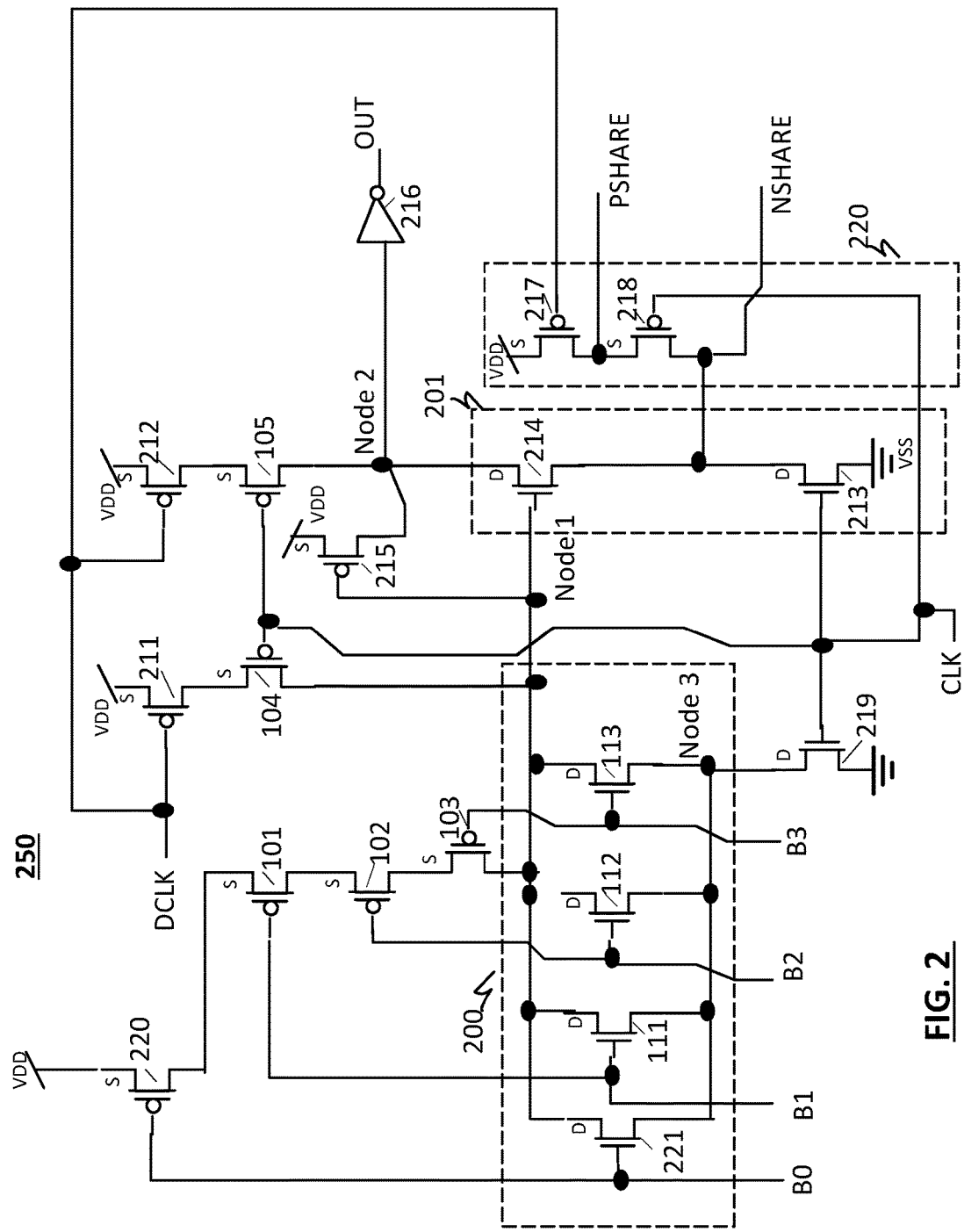
FIG. 2 depicts an example dynamic decode circuit with a DCLK clock.

Referring to Prior Art FIG. 2, the circuit 250 employs serial pairs of clocking pfet transistors 104 211, 105 212 and 218 217 to perform the precharge functions. Preferably the precharge phase starts at a predetermined time after the end of the evaluation phase (CLK high). During the predetermined period, the result of the evaluation is maintained. Each serial pair includes a respective CLK pfet transistor 104 105 218, and a respective DCLK pfet transistor 211 212 and 217. A DCLK signal applied to the DCLK pfet transistor causes the start of the precharge cycle to be delayed.

Figure 10:
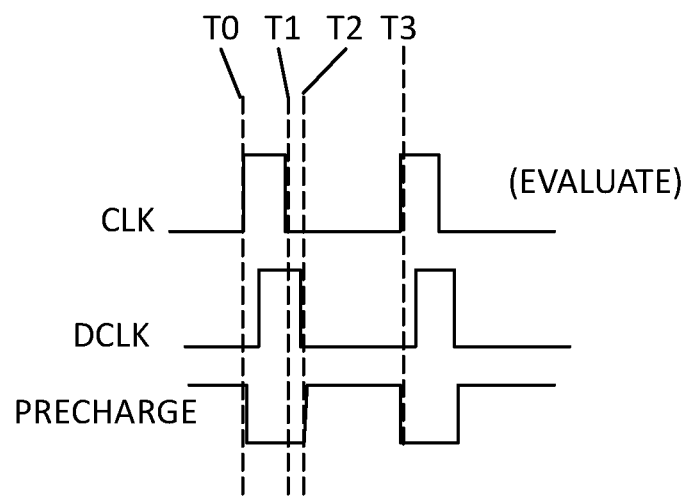
FIG. 10 depicts a prior art example of a timing relationship of Evaluate and Precharge.

In an embodiment the DCLK signal may be a delayed version of the evaluation clock signal CLK as shown in Prior Art FIG. 10. CLK may be passed through two inverters 901 and 902 to produce the delayed DCLK signal. Other means may be used, for example, CLK may be passed over a delay line (long wire) to produce a DCLK.

FIG. 10 shows the relationship of the example precharge function wherein precharge is delayed for a predetermined period T1-T2. The CLK signal goes high at T0 and goes low at T1. DCLK is depicted as a delayed version of CLK that goes low at T2. The precharge circuits (105 212 for example) causes the respective precharged node (NODE 2) to go high at T2 when both CLK and DCLK are low and then low again at T3 when CLK goes high. Of course, in other embodiments, different circuitry may be used to create the precharge function. In an embodiment, CLK is used to clock the nfets and a PCLK is used to clock the precharge pfets. PCLK is created to have the relationship to CLK of the PRECHARGE signal depicted in FIG. 10.

Returning to FIG. 2, in different embodiments, the effective precharge may start before or after CLK, and may have an active period greater or less than CLK. Pfet keeper transistor 215 attempts to hold NODE 2 high as long as NODE 1 is low. The evaluation clocking section 201 is different as NODE 3 is now precharged via a serial pair of pfet transistors 217 and 218 receiving DCLK and CLK respectively. Furthermore NODE 3 may be made available to other circuits as an NSHARE signal to provide the precharged evaluation NODE 3 to other circuits.

Figure 3:
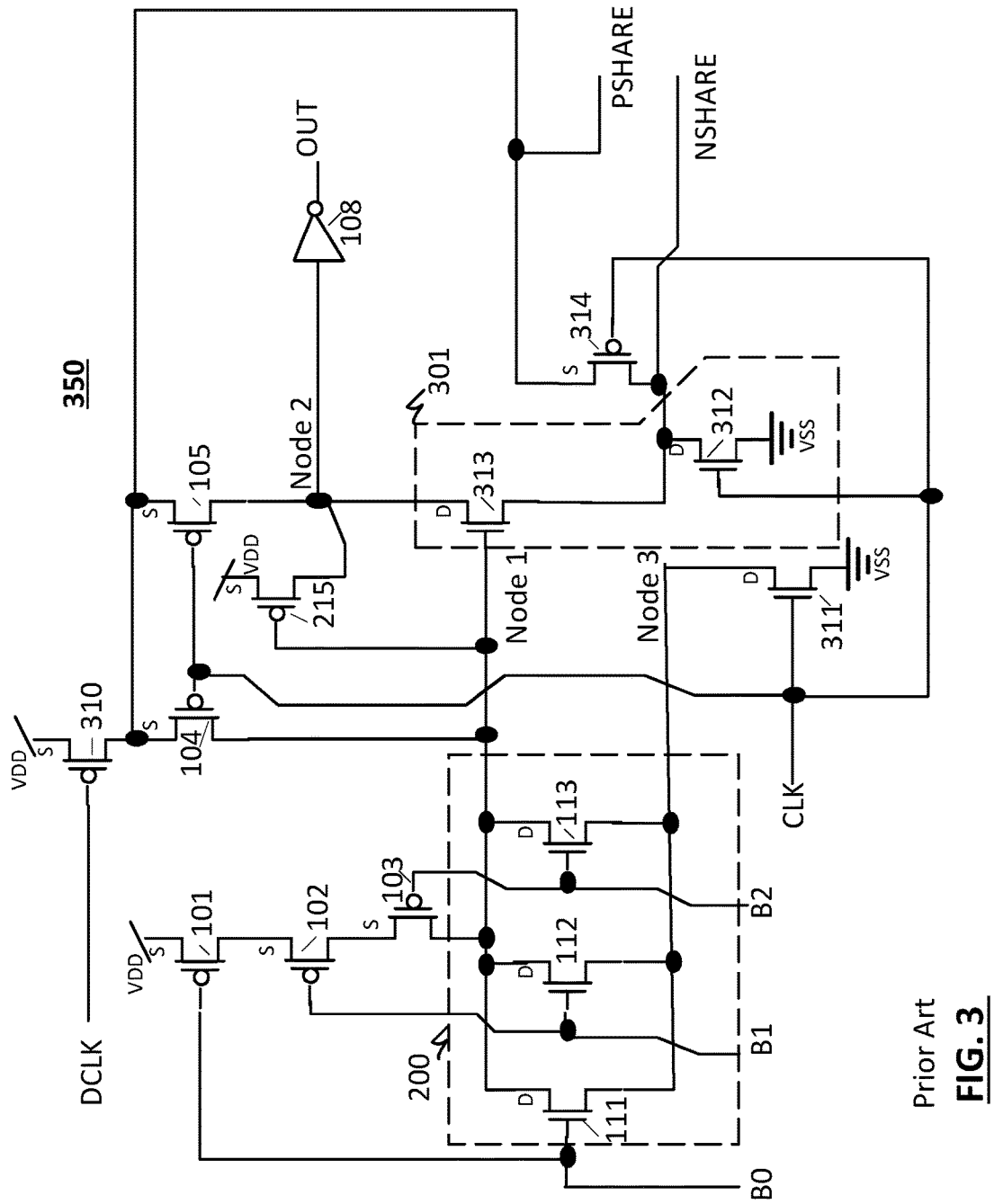
FIG. 3 depicts a prior art example dynamic decode circuit with a DCLK clock and isolated NODE 3.

Referring now to Prior Art FIG. 3, another example embodiment is shown. In this case, a PSHARE node may be created to provide the DCLK function to other circuits. In this implementation, each node to be precharged NODE 1, NODE 2 and NODE 3, has an evaluation clock pfet transistor 104, 105 and 312, but not a pair. Instead each valuation clock pfet transistor source 104 105 and 312 is connected to the drain of a single DCLK pfet transistor 310. Furthermore, in this example, NODE 3 is not precharged but may be separately clocked by evaluation nfet transistor 311 and NSHARE may be separately clocked by evaluation nfet transistor 312 in series with nfet transistor 313. In this embodiment, NSHARE is precharged according to the delay described in FIG. 10, but NODE 3 is not precharged directly. In an implementation, another node may be precharged, for example NODE 3. In another embodiment, another node may perform a SHARE function, for example, NODE 3 may be shared by multiple modules 350 to reduce the size of nfet 311.

Referring again to FIG. 2, when the evaluation clock signal (CLK) is in the precharge state (low), the circuit 250 may be in the precharge or restore state. In this state, NODE 1, NODE 2, NODE 3 may be all precharged to high. The DCLK signal may be logically the same as CLK but delayed in time to allow for a wider output pulse to delay the start of precharge. When the CLK signals transitions high or evaluate state, the input signals B0 B1 and B2 will be evaluated. Therefore, if one or more of the input signals B0 B1 B2 goes high, NODE 1 will transition to low, thus turning off nfet 214 and NODE 2 will maintain its original precharge high voltage state. The transition of NODE 1 to low turns on the keeper pfet transistor 215. Thus transistor 215 will maintain the original high voltage state on NODE 2. At the end of the operation or cycle, CLK and DCLK will transition back to low and all precharge transistors: 104 105 218, will be in their conduction state with NODE 1, NODE 2, NODE 3 and NSHARE held in the high voltage state. Thus the output signal OUT will maintain a low (not selected) state.

By precharging the NSHARE NODE 3 every cycle, the source terminal of nfet 214 transitions to the low state with NSHARE during the evaluation phase when transistors 213 219 conduct. While at the same time NODE 1 will transition to the low during the evaluation phase when any decode transistor 221 111 112 113 conducts. Therefore the nfet 214 gate-to-source voltage may be kept below the turn on voltage necessary for that device to conduct. This minimizes glitching of NODE 2, and allows the arrival of input signals B0 B1 B2 to be coincident to the CLK input without any impact to functionality. Therefore, by precharging the node NSHARE, a built-in delay is provided allowing the input decode stage 200 to evaluate (pull-down) before the nfet evaluation stack 201 consisting of nfet transistor 213 and nfet transistor 214 (connected to NODE 2) can conduct thus allowing for a small setup time between the input signals B0 B1 B2 and the evaluation clock signal CLK.

When the evaluation clock signal (CLK) is in the precharge phase (low), the circuit 250 may be in the precharge or restore state according to the precharge start delay previously described. In this state, NODE 1, NODE 2, NODE 3 and NSHARE may be all precharged to the high voltage state. Again, the DCLK signal may be logically the same as evaluation clock signal CLK but delayed in time to allow for a wider output pulse to delay the start of precharge. When the CLK signals transitions to high (or evaluation), the input signals B0 B1 B2 will be evaluated. Therefore, if all input signals B0 B1 B2 are low, NODE 1 will maintain its original precharge high voltage state, thus allowing nfet 214 to conduct and NODE 2 will transition to low when NSHARE transitions to low. Thus pfet keeper transistor 215 will be in the non-conduction state, so as to allow NODE 2 to transition to low and the output signal OUT to transition to high (the selected state). At the end of the operation or cycle, CLK and DCLK will transition back to low and all precharge transistors will be in the conduction state so as to precharge NODE 1, NODE 2, NODE 3 and NSHARE back high. Finally, the output signals OUT will transition back to low when the delay clock DCLK transitions back to low. This delay DCLK action allows for an output OUT pulse width is wider than the CLK pulse width. A keeper function may be provided with pfets 220 101 102 103 such that with all inputs B0 B1 B2 low, NODE 1 may be kept high by the conduction of the 3 serial pfets 101 102 103.

The NSHARE node allows for multiple dynamic decode circuits to share the bottom nfet 213, 312 for larger effective pull-down strength and an overall faster evaluate action of NODE 2's transition to the low voltage state. Each dynamic decode circuit has a bottom nfet and conducts in parallel with all other bottom nfets, so the bottom nfets can be significantly smaller in an embodiment where only one of the multiple dynamic decode circuits will be selected by its decode function.

Referring to FIG. 3, a further enhancement may be the addition of the PSHARE node to further reduce the load on the DCLK signal while delivering a larger effective pull-up strength. Also shown is the addition of a separate pull-down nfet 311 for the input NOR circuit. With this approach, NSHARE may be separated from the new NODE 3 allowing additional circuit optimization for glitch reduction on NODE 2.

NSHARE and PSHARE may be of particular use in logic modules that function mutually exclusively as in an application of decode circuit 350 for example. In that application, the same logic module design may be used repetitively to select, for example, a respective word-line of a randomly accessed memory (RAM). Since only one module 350 can be selected by a particular address (inputs B0 B1 B2), only one module 350 OUT will be activated for any particular address. Thus, the evaluate CLK nfet 312 for each module 350 will operate in parallel, so the nfet 312 can be much smaller. In an example, eight decode modules 350 using NSHARE need only implement nfets 312 ⅛th the size of a module 350 not using NSHARE to achieve the same current capability.

PSHARE similarly shares the precharge pfet 310 amongst multiple modules, thus the pfet 310 can be ⅛th the size of a pfet not using PSHARE.

Not only does PSHARE reduce the physical size of a die used for modules 350, it may also cause the module to be faster than a traditional dynamic logic implementation.

Figure 4:
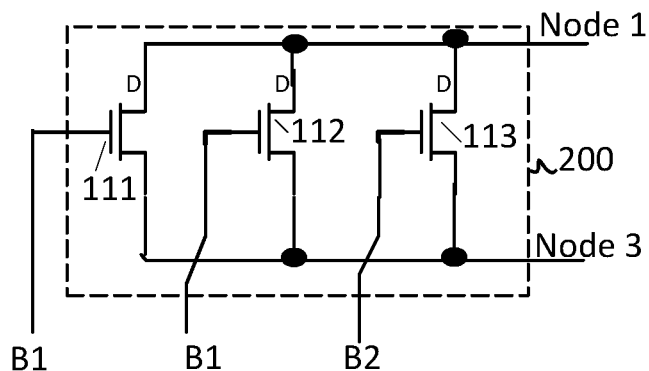
FIG. 4-FIG. 6 depict prior art example of a decode functions.
Figure 5:
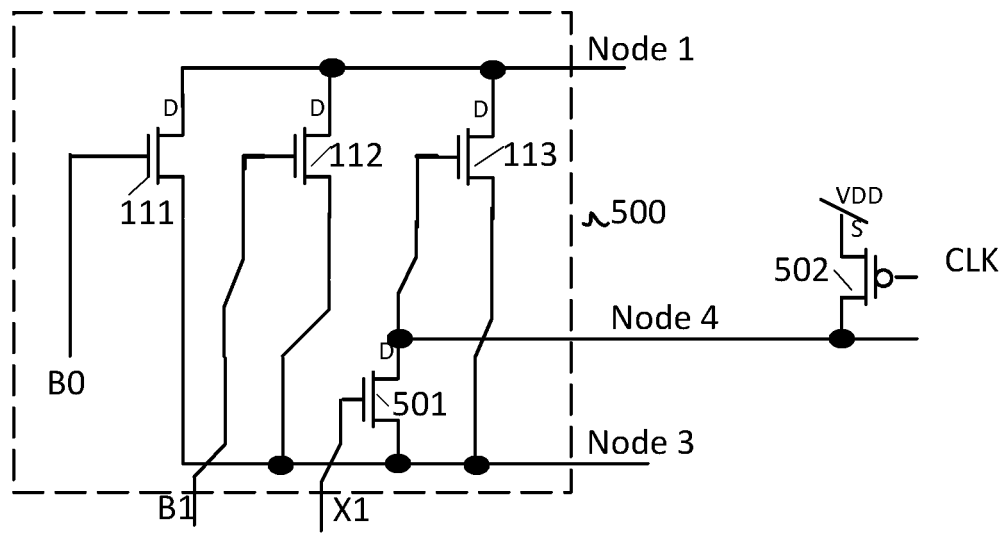
Figure 6:
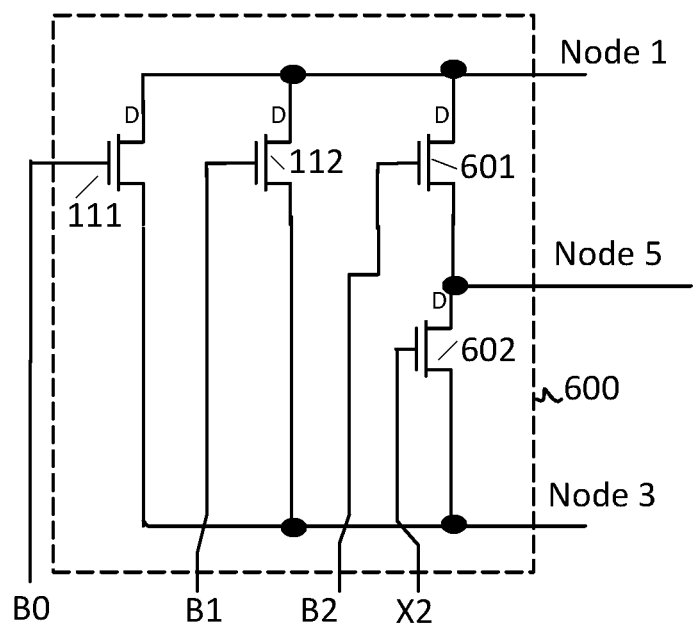

Other embodiments may include other decode circuits other than 200. Prior Art FIG. 4 depicts a decoder consisting of parallel nfets 111 112 113. Prior Art FIG. 5 depicts a decoder 500 consisting of another arrangement of nfet transistors. Prior Art FIG. 6 depicts a decoder consisting of both parallel 111 112 and serial 601 602 nfet transistors.

Figure 7:
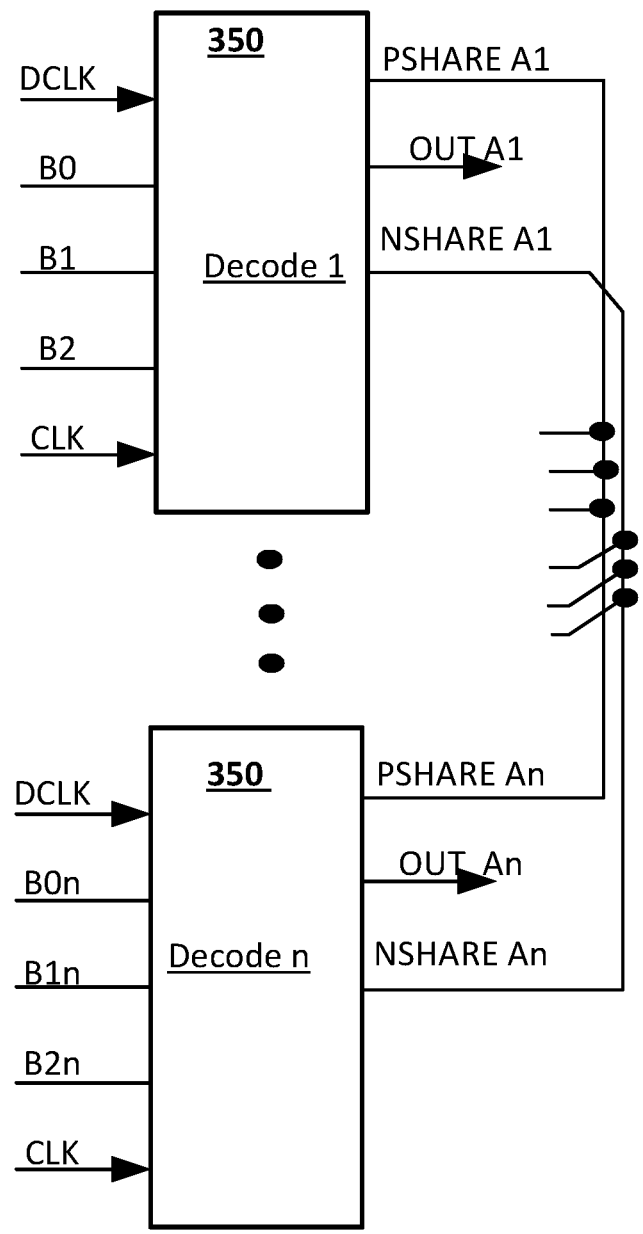
FIG. 7 depicts a prior art use of PSHARE and NSHARE.

Prior Art FIG. 7 depicts an example PSHARE NSHARE embodiment, depicting n modules 350 Decode 1 through Decode n of dynamic decode circuit Prior Art FIG. 3 for example. Since the decode circuit 200 of each module 350 is decoding a unique function, the decode circuit 200 of only one of the Decode modules can conduct for any particular cycle. One module 350 Decode 1 receives inputs B0 B1 B2 for determining OUT A1, the other module 350 also receives inputs to determine mutually exclusive OUT signals. The nth module is shown Delay n having inputs B0n B1n B2n and producing OUT signal OUT An. All NSHARE A1 through NSHARE An nodes are commonly wired as are all PSHARE A1 through PSHARE An nodes. Therefore current for evaluation is provided by each transistor 312 in parallel although only one Delay module decode is active, therefore each nfet transistor 312 need only handle 1/nth the current and can be much smaller. Similarly, each DCLK transistor 310 operating in parallel, only needs to provide current for 1/nth the requirement and only needs to be 1/nth the size.

The DCLK pfet 310 may be 1/nth the size of a non PSHARE implementation because the pfets 310 of each module operate in parallel but only one module is selected. Similarly the nfets 312 may be 1/nth the size of non NSHARE implementations because the nfets 312 of each module operate in parallel but only one module is selected.

Figure 8:
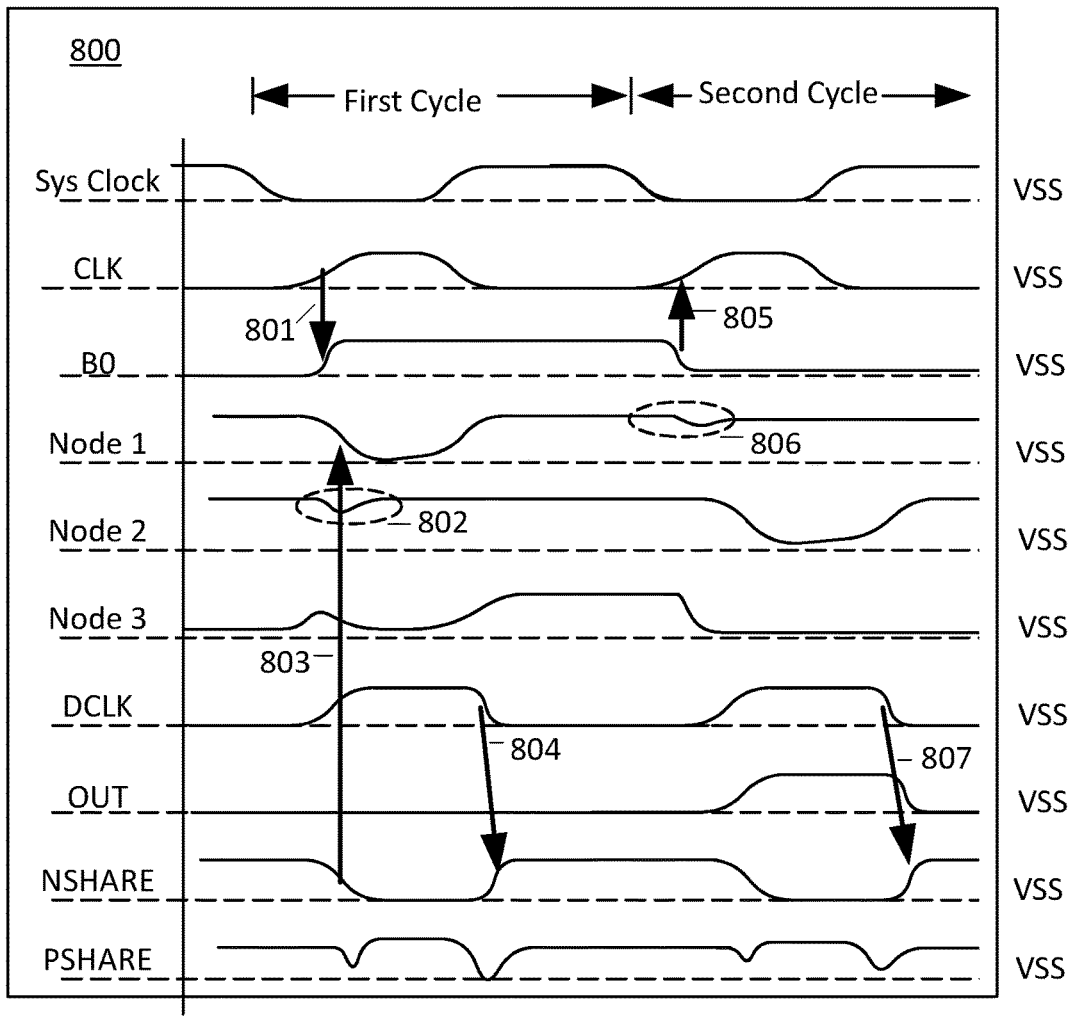
FIG. 8 depicts a prior art timing chart according to an example implementation.

Prior Art FIG. 8 shows an example voltage waveform 800 of the decode circuits 350 having decoder 200 performing a NOR function. The first cycle may be indicated by the falling edge of system clock. In the first cycle, all inputs stay low except for B0 which transitions high. The evaluation clock "CLK" may be a delayed version of system clock in an embodiment. The first cycle shows 801 the evaluation clock signal "CLK" rising at the same time the input B0 may be rising. This signal relationship shows what may be called a zero setup-time; therefore, with B0 high, the decoder 200 may be in a non-selected state (the NOR function requires all inputs be low), so notice the falling edge of NODE 1 turning off the nfet 214 313. Also, there may be a relatively small downward glitch 802 on NODE 2 where most of the glitch may be due to the normal capacitive coupling action from the downward movement of NODE 1. Also, there may be a downward voltage transition of NSHARE. As mentioned above, the delay 803 of NSHARE vs the falling transition of NODE 1 due to the precharging of NSHARE, prevents the nfet 214 from turning on, thus minimizing the glitch seen on NODE 2.

The second cycle shown shows the case where all inputs may be at the low state (selected state) except for input B0. In this cycle input B0 transitions 805 from high to low at the same time the input clock CLK transitions to high (to the evaluate clock state). In the fully selected state (all inputs low), NODE 2 transitions to low and the output (OUT) transitions to high. Notice here that NODE 2 glitches slightly downward 806, but recovers and may be held high by the active pull-up action of the pfet keeper stack 101 102 103. Also notice the falling edge of DCLK 807 which triggers the delayed beginning of the precharge of NODE 1, NODE 2, NSHARE and PSHARE.

A timing diagram of FIG. 2, where NSHARE may be common with NODE 3 would have a different wave form. For an example, NODE 3 may be precharged along with NSHARE, so the wave form for NODE 3 would go high when DCLK goes low on the second phase.

Various combinations of nfet transistors may be employed to perform decode functions within the scope of embodiments. Other decode functions may include combinations of pfet and nfet transistors. Furthermore these embodiments may advantageously provide internal nodes subject to precharge over and above NODE 1 and NODE 3. Referring to FIGS. 4, 5 and 6, various example alternatives of input decoders 200 may be depicted. Prior Art FIG. 4 depicts the NOR gate function as shown in FIG. 1, FIG. 2 and FIG. 3. The function of NODE 1 may be not-B0 ($\overline{B0}$) AND not-B1 ($\overline{B1}$) AND not-B2 ($\overline{B2}$). Other decoders may be well known in the art and may employ nfets in various arrangements.

FIG. 5 shows one example decoder circuit 500 which includes nfet transistors 111 112 of FIG. 2, wherein nfet transistor 501 may be an inverter configured to feed the gate of nfet transistor 113 and includes an internal NODE 4 connected to the drain of nfet transistor 501. The function of NODE 1 of FIG. 5 may be not-B0 ($\overline{B0}$) AND not-B1 ($\overline{B1}$) AND X1. In this decoder, new nodes may be introduced (NODE 4) requiring a precharge function pfet 502.

FIG. 6 depicts example decode circuit 500 that includes nfet transistors 111 and 112 of FIG. 2 and serial transistors 500 601 having an internal NODE 5. Input B2 and X2 must both be high in order to pull NODE 1 low. The function of decoder 500 may be not-B0 ($\overline{B0}$) AND not-B1 ($\overline{B1}$) AND [not-B2 ($\overline{B2}$) OR not-X2 ($\overline{X2}$)].

One skilled in the art will appreciate that serially connected transistors may be serially connected in any order, for example, evaluation clocking sections 201 clocked transistor 213 could be connected to NODE 2, and transistor 214 could be connected to VSS without departing from the teaching. Furthermore, the transistors receiving DCLK 211 212 217 could be serially connected to respective transistors 104 105 218 such that the transistors receiving CLK are connected to VDD, and the transistors receiving CLK are connected to respective nodes NODE 1 NODE 2 NSHARE. Furthermore in embodiments, nodes other than PSHARE and NSHARE may be shared between a plurality of dynamic decode circuits in order to reduce the size of transistors sharing current. For example, NODE 3 could be shared in order to reduce the size of shared evaluation clocking transistor 311.

Figure 11:
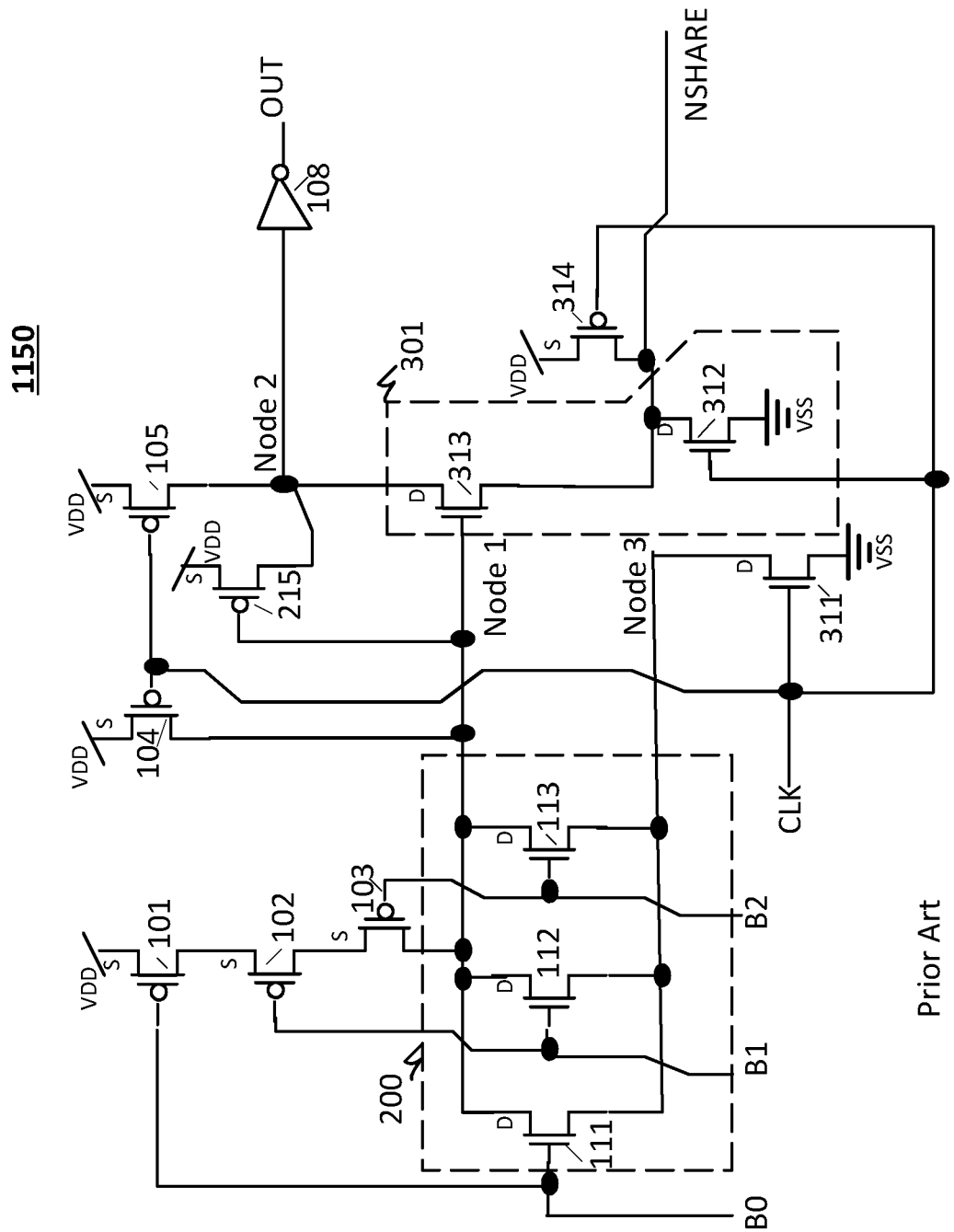
FIG. 11 depicts a prior art example of a dynamic decode circuit with CLK clock.

Referring to FIG. 11, an embodiment 1150 is shown utilizing precharge circuits consisting of respective single precharge transistors 104 105 314.

Dynamic Decode Circuit Low Power Application:

In previous dynamic decode circuits for creating on output pulse indicating inputs were in a predetermined state (TRUE) such as that depicted in FIG. 3, an extra delay was incurred when a positive (high) output was required, for example by use of an inverter 108 to change the pulse from a negative (low) pulse to a positive (high) pulse.

Furthermore, dynamic decode circuits were likely to use nfet transistors to evaluate circuits based on an evaluate clock (+CLK) being active (high), and pfet transistors to precharge nodes based on the evaluate clock (+CLK) being inactive (low).

Furthermore, dynamic decode circuits for creating an output pulse often created the output pulse only when the predetermined state was all inputs being negative.

In an embodiment, a logic circuit drives the inputs B0 B1 B2 B3 of the dynamic decode logic knowing the inputs of the dynamic decode logic will cause an output to go high when the inputs are all high. The logic circuit will then encode the driven bits accordingly. If the driven bits I0 I1 I2 I3 are an encoded 4, the driven bits I0 I1 I2 I3 would be 0100. For positive active input bits an inverter is inserted between each pair of I0 and B0, I2 and B2 and I3 and B3 to produce all high bits when the driven bits are 4. For negative active input bits, an inverter is inserted between I2 and B2 to produce all high bits when the driven bits are 4.

Figure 15:
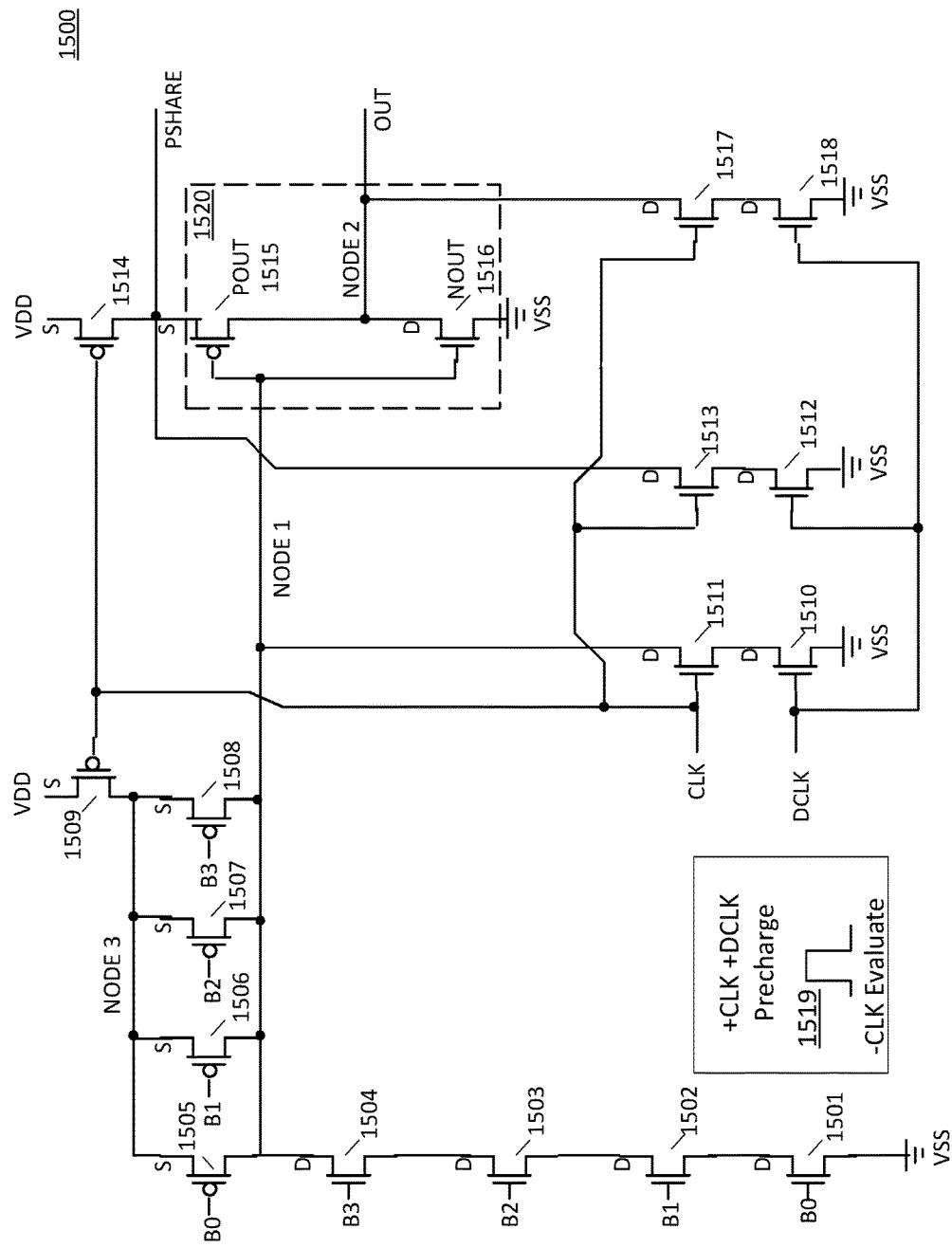
FIG. 15 depicts a dynamic decode circuit with a single gate delay output.
Figure 17:
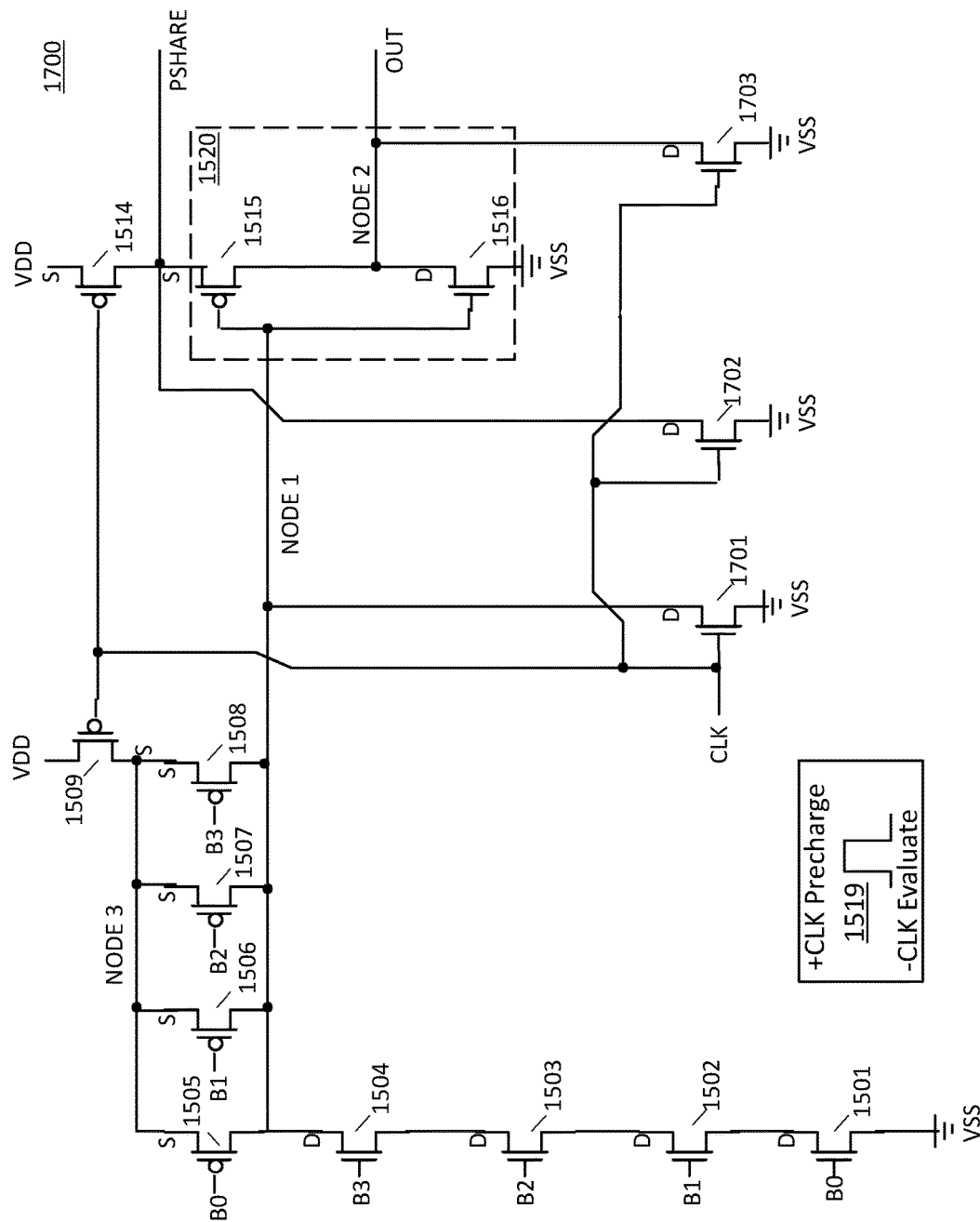
FIGS. 17-18 depict alternative dynamic decode circuits with a single gate delay positive output.
Figure 18:
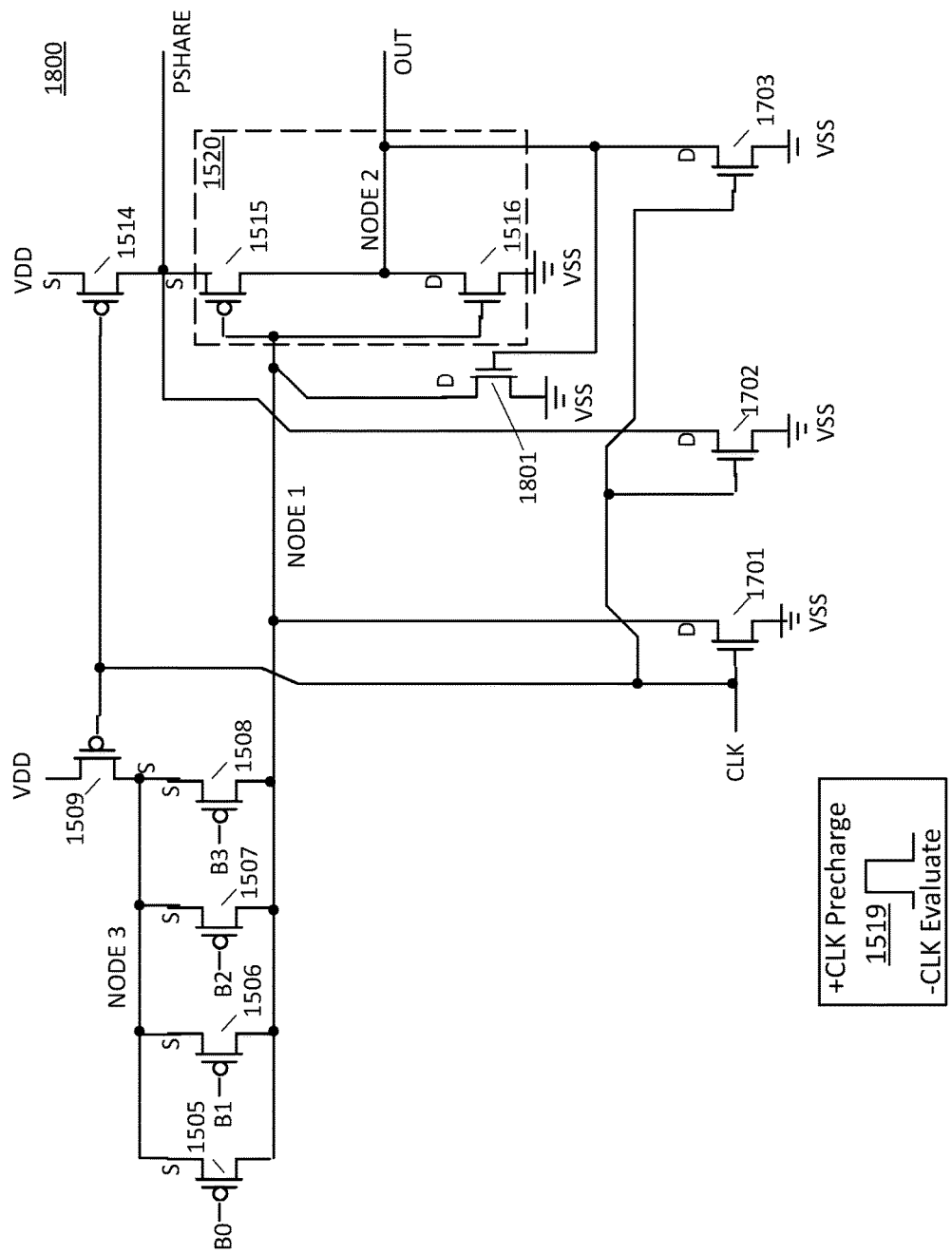

In a low power application, new dynamic decode circuits are proposed FIGS. 15, 17, 18 that eliminate the need for the extra inverter stage FIG. 3 108 to create a positive output pulse. In order to eliminate the inverter 108, the node 2 would be pulled positive during the evaluation phase. The new circuits utilizes nfets to precharge low, and pfets to evaluate high. One of ordinary skill would assume that the new circuit would be slow and consume more power since previous circuits utilized pfets for precharge since they are slow and nfets for evaluation logic since they are fast. Furthermore, the new circuits would eliminate the inverter in the output path, but add an inverter in the input path, resulting in no savings in performance or power. The inventors being highly skilled have determined that the new circuit could outperform previous circuits, especially for low power implementations, and reduce circuit size and power.

Figure 19:
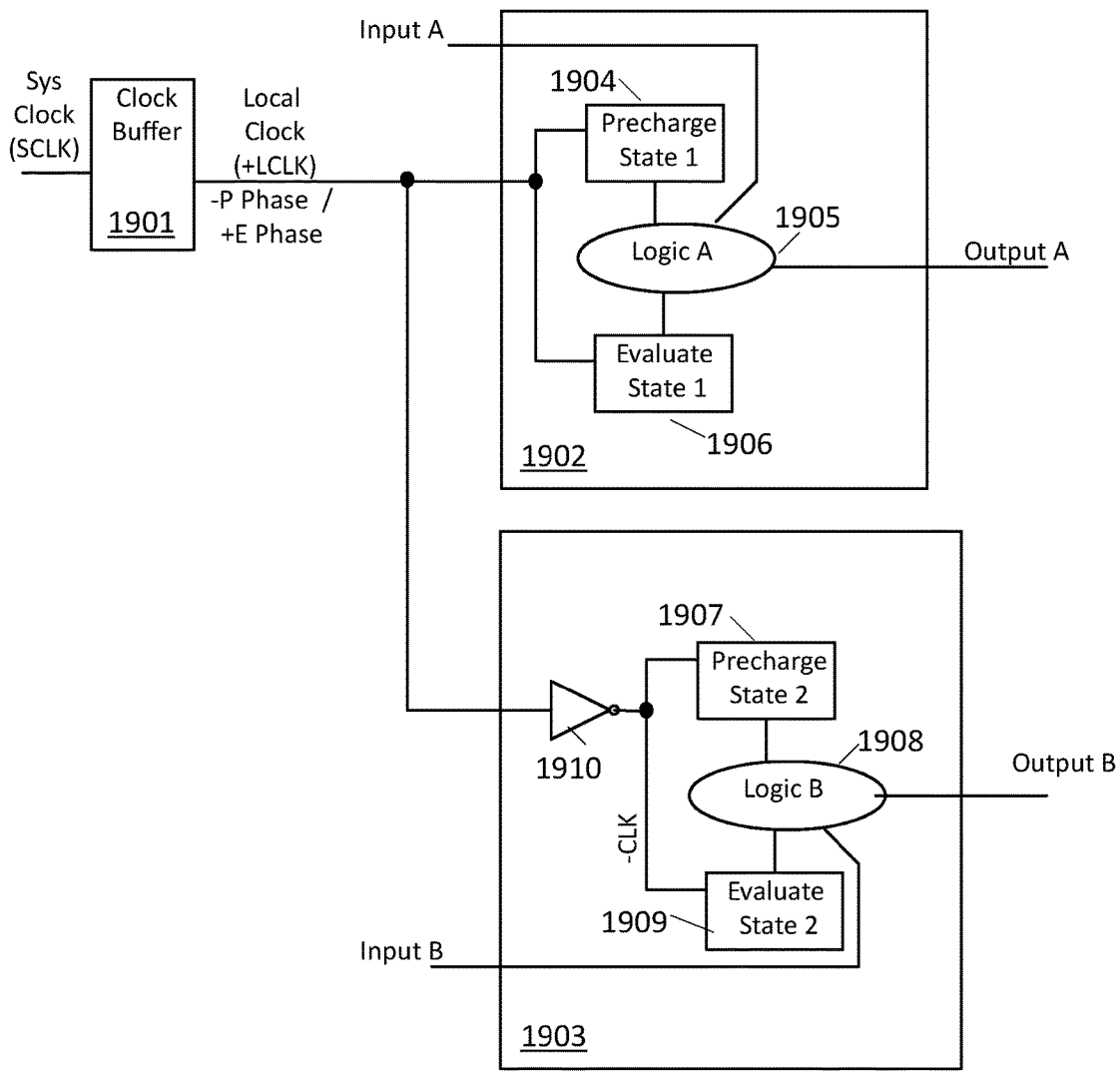
FIG. 19 depicts a system utilizing an LCLK and an inverted LCLK.

In an embodiment of the new circuit where nfets precharge and pfets evaluate, referring to FIG. 19, a clock buffer 1901 may generate a local clock +LCLK from a global clock signal, the local clock to be used as the clock (CLK) for a dynamic logic circuit. Clock buffers 1901 may be used on chips to provide consistent clock signals to areas of local logic of the chip. A Clock buffer may be programmable to support dynamic testing of circuits or to adjust local clock signals. In an embodiment were only a "high active" clock +CLK is available (i.e. +CLK is high during the evaluation phase and low during the precharge phase) a local inverter 1910 would be needed to generate the "low active" −CLK for the new circuit resulting in an extra inverter delay 1910 during the decode evaluation. However, now the CLK input capacitance (Cclk) of the new circuit FIGS. 15 17 18 would be the gate capacitance (Cg) of 5 transistors 1509 1514 1701 1702 1703. This Cclk is shielded from the upstream Clock Buffer 1901 by the local inverter 1910 resulting in an overall faster performance and may result in a smaller LCBP to drive the dynamic decode circuit network capacitance. For example, for a 4-to-16 decoder, the LCBP would have to drive a load of Cclk×16 if it provided a "low active"−CLK. If an inverter is selected with input capacitance of ½ of Cclk (drive "tapering of 2"), Then a 2× smaller LCBP can be employed while still delivering equal or better clocked performance vs the prior art shown in FIG. 1. Now the performance of the LCBP will improve due to the 2× smaller CLK load. Also, a smaller (lower power) LCBP can be used to save on device size (smaller leakage power and dynamic power). Now the designer can make the desired trade-off of faster performance or lower dynamic and static power. Also, the new circuit presents only one gate delay between the clock signal −CLK and the positive output OUT where the previous implementations having an output inverter had two sequential gate delays between the clock signal +CLK and a positive output OUT.

The new dynamic decode circuit utilizes a low active clock signal during the evaluation phase by inverting a high active clock signal. The new dynamic decode circuit is advantageous for low power applications that have low capacitance loads and requires reduced leakage current and reduced dynamic switching current due to elimination of a pfet and nfet of the previously needed inverter 108. The new dynamic decode circuit preferably implements a predetermined input state comprising all inputs being high.

Each cycle of a dynamic decode circuit consist of a precharge phase followed by an evaluate phase. Preferably, the dynamic decode circuit may decode a plurality of inputs to produce a positive pulse based on an evaluate clock being active, the pulse indicating that the inputs are in a predetermined state. In a preferred embodiment, the predetermined state is all inputs of the plurality of inputs being high.

The dynamic decode circuit preferably comprises a decoder stage and an evaluate stage. The decoder stage of dynamic logic having nfet transistors for causing a first node (NODE 1) to be low during the precharge phase of a cycle, the decoder may cause the first node to be low when the inputs are in the predetermined state (TRUE) during the evaluate phase of the cycle, the decoder stage may cause the first node to be high when the inputs are not in the predetermined state during the evaluate phase.

The evaluate stage, may create a positive output pulse on a second node (OUT) based on the first node being low. The output pulse may be positive only during the evaluate phase of a cycle having inputs in the predetermined state. The evaluate stage may create no positive output pulse in a cycle not having inputs in the predetermined state Preferably the output pulse is generated within only one pfet gate delay of a clock signal (CLK).

Figure 12:
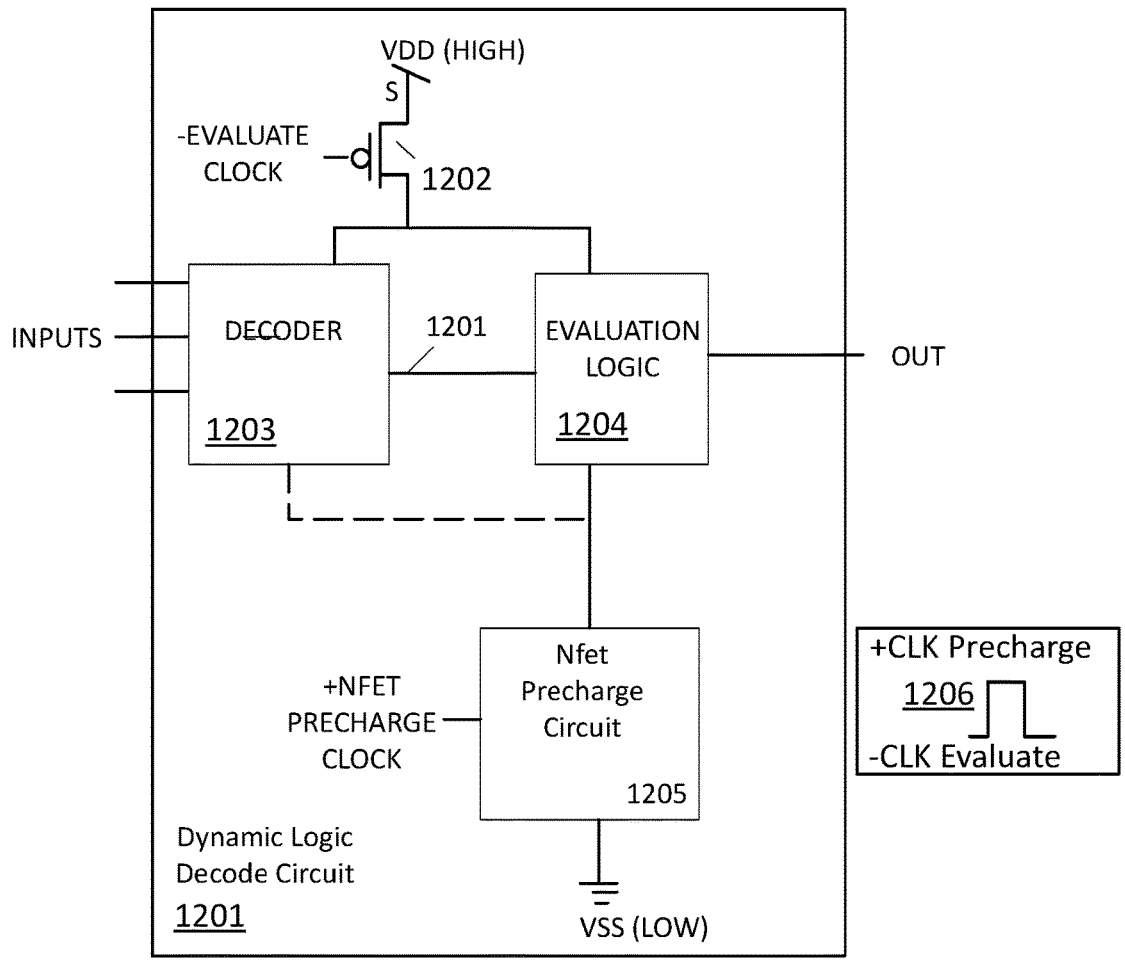
FIG. 12 depicts a dynamic decode circuit having nfet precharge and pfet evaluate circuits.

FIG. 12 depicts a dynamic decode circuit 1201 with an nfet precharge circuit 1205 tied to a low power supply (VSS) and a pfet evaluate transistor 1202 tied to a high power supply (VDD). The dynamic decode circuit 1201 receives a plurality of inputs to produce an output (OUT). The inputs are decoded by a decoder 1203 and the result of the decode is passed to the evaluation logic 1203 by a first node 1201. The dynamic decode circuit incorporates an evaluate clock signal that cause an evaluate phase when the signal is low (−) and a precharge phase when the clock signal is high (+) 1206. A pfet evaluate transistor 1202 pulls logic of a decoder 1203 and evaluation logic 1203 high when the evaluate clock is low. An nfet precharge circuit 1205 pulls logic of at least one of the decoder 1203 and the evaluation logic 1203 low when an nfet precharge clock is high. Clock signal 1206 shows +CLK is in precharge phase when the CLK is high, and −CLK is in evaluation phase when the CLK is low.

Figure 13:
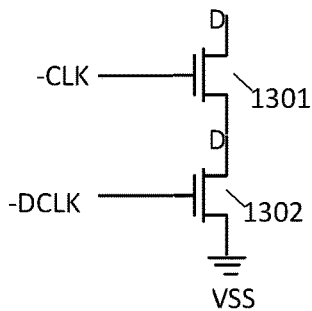
FIGS. 13-14 depict nfet precharge circuits.

Referring to FIG. 13, the precharge circuit may incorporate a pair of serially connected nfet transistors 1301 1302 receiving a precharge clock consisting of a evaluate clock signal −CLK and a delayed CLK (−DCLK). The precharge circuit may consist of one nfet transistor 1301 having a gate for receiving the evaluate clock signal −CLK, and another nfet transistor 1302 having a gate for receiving the delayed version −DCLK of the evaluate clock −CLK, whereby the beginning of the precharge phase is delayed by a predetermined amount from the end of the evaluation phase.

Figure 14:
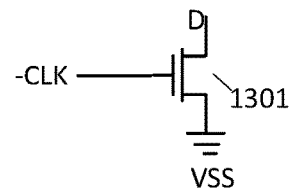

Referring to FIG. 14, the precharge circuit may incorporate only a single nfet transistor 1301 having a gate for receiving precharge clock consisting of the evaluate clock signal −CLK.

Referring to FIG. 15, an embodiment of a dynamic decode circuit 1500 is shown. The dynamic decode circuit 1500 is configured to cause an output OUT (NODE 2) to go high when all the inputs are high within one gate delay of an evaluate clock −CLK going active (low). The dynamic decode circuit 1500 having a decoder comprising a plurality of pfet decoder transistors 1505 1506 1507 1508 connected in parallel between a first node and a third node, the third node connected to an evaluate transistor 1509 having a gate configured to receive the evaluate clock signal −CLK. Each pfet decoder transistor 1505 1506 1507 1508 having a respective gate connected to a respective input B0 B1 B2 B3. In this embodiment, a keeper circuit consisting of a plurality of serially connected nfet keeper circuits 1501 1502 1503 1504 having respective gates connected to respective inputs is shown. The keeper circuit is conductively connected between a low power source VSS and the first node.

In this embodiment, NODE 1 is precharged by a first precharge circuit, a PSHARE node is precharged by a second precharge circuit and NODE 2 is precharged by a third precharge circuit. The first precharge circuit consisting of serially connect precharge transistors 1510 1511 configured to receive respective precharge clock signals and DCLK. The second precharge circuit consisting of serially connect precharge transistors 1512 1513 configured to receive respective precharge clock signals –CLK and –DCLK. The third precharge circuit consisting of serially connect precharge transistors 1517 1518 configured to receive respective precharge clock signals and –DCLK.

Circuit 1500 further comprises an evaluation circuit consisting of an inverter 1520 serially connected between a low power source VSS and a PSHARE node. The inverter 1520 inverting the signal of NODE 1 to produce NODE 2 OUT during the evaluate phase. The invertor consisting of a first pfet invertor transistor 1515 and a second pfet invertor transistor 1516, serially connected by the NODE 2. The inverter circuit 1520 connected by a PSHARE node to a high power source VDD by way of a pfet evaluate transistor 1514.

In an embodiment, NODE 3 and PSHARE are connected and only one of evaluate transistor 1509 and 1514 is needed.

Figure 16:
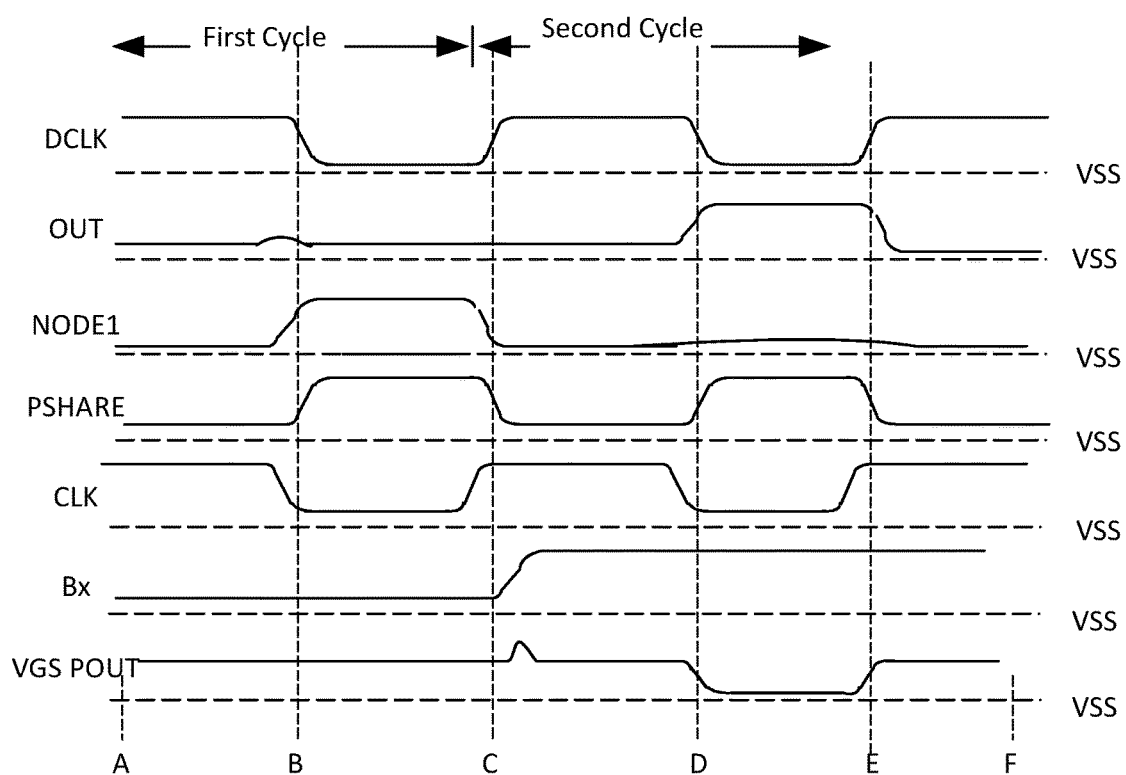
FIG. 16 depicts an example timing diagram elements of the dynamic decode circuit with a single gate delay positive output.

Referring to FIG. 16, a timing diagram depicts relationships of various signals of dynamic decode circuit 1500. The diagram depicts two clock periods, a first cycle and a second cycle. A –CLK signal and a DCLK signal are received, the –DCLK signal being a delayed version of the –CLK signal. The AND of the two clock signals produces the precharge phase, the beginning of which is delayed following the end of the evaluate phase. The PSHARE node is pulled low during the evaluation phase and pulled high during the precharge phase.

In the first cycle, precharge phase begins at A when both clocks are high and ends at B when –CLK goes low. In the first phase at least one of the inputs Bx is low which will cause the output OUT to be low since the decode is FALSE. Because Bx is low, NODE 1 will go high when the evaluate clock –CLK goes low. Since NODE 1 is high during the evaluation phase, the voltage VGS POUT of the source of pfet transistor 1515 will be high relative to the gate of pfet transistor 1515 as shown, so transistor 1515 will not conduct causing the output OUT to remain low indicating the decode is FALSE. The precharge 1519 is performed when the CLK and DCLK signals are high +CLK and +DCLK, and evaluation is performed when the CLK signal is low –CLK.

In the second cycle, precharge is performed between C and D, and all inputs Bx are high causing NODE 1 to be low during the evaluate phase D to E. Since NODE 1 is low, VGS POUT of pfet transistor 1515 will be low because 1515 is conducting. Therefore OUT will go high from D to E, to produce a positive OUT indicating that the decode is TRUE. Significantly, the OUT node TRUE/FALSE result is only one gate delay following the –CLK going active (low).

Referring to FIG. 16, in the second cycle C-E, the dynamic decode circuit is precharged when both –DCLK and –CLK are high during the precharge phase C-D of the clock cycle, Since the inputs Bx are all high during the evaluation phase D-E, NODE 1 remains low and an output pulse is OUT generated D-E on NODE 2.

FIG. 17 depicts an embodiment 1700 of 1500 that incorporates respective single nfet transistor precharge circuits 1701 1702 1703 receiving respective –CLK signals and no DCLK signals.

FIG. 18 depicts a dynamic decode circuit 1800 having a single transistor nfet keeper circuit 1801 instead of the serial transistor keeper circuits 1501 1502 1503 and 1504 of dynamic decode circuits 1500 and 1700. The single transistor nfet keeper circuit 1801 having a gate connected to OUT being disposed between the low power source VSS and NODE 1.

FIG. 19 depicts a high level view of an embodiment. A Clock Buffer 1901 receives a System Clock (SCLK) and drives one or more Local Clocks LCLKs, the LCLK signal has a precharge phase (P Phase) and an evaluate phase (E Phase). In an embodiment, the E Phase is a positive LCLK. In an embodiment, two dynamic logic circuits are provided 1902 1903. A first dynamic logic circuit 1902 precharges 1904 Logic A 1905 to a first state (Precharge State 1) based on the LCLK being in a second state. The first dynamic logic circuit 1902 Evaluates 1906 Logic A 1905 to the second state (Evaluate State 1) to produce a signal at Output A based on Input A having a predetermined value and the LCLK being in the first state. A second dynamic logic circuit 1903 precharges 1907 Logic B 1908 to the second state (Precharge State 2) based on LCLK being in the first state. The second dynamic logic circuit 1903 Evaluates 1909 Logic B 1908 to the first state (Evaluate State 2) to produce a signal at Output B based on Input B having a predetermined value and the LCLK being in the second state. The second dynamic logic circuit utilizes an inverter 1910 to convert LCLK signal to an internal –CLK so the state of the +LCKL is inverted to produce the –CLK.

Figure 20:
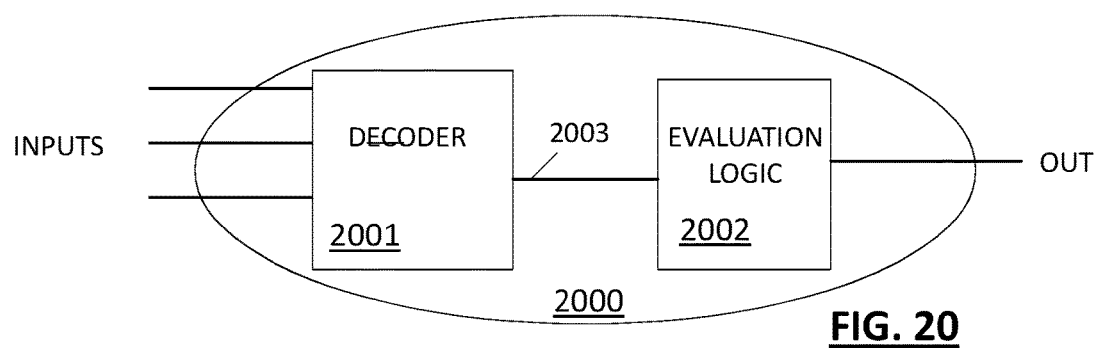
FIG. 20 depicts components of a dynamic decode circuit.

Referring to FIG. 20, an example Decode logic is depicted, which could be dynamic decode circuits of Logic A 1905 or Logic B 1908. Inputs are received by dynamic logic Decoder 2001 which presents a TRUE signal 2003 to Evaluation Logic 2002 when all the inputs are in a predetermined state. The evaluation Logic produces an output (OUT) indicating whether the signal 2003 was TRUE.

Figure 21:
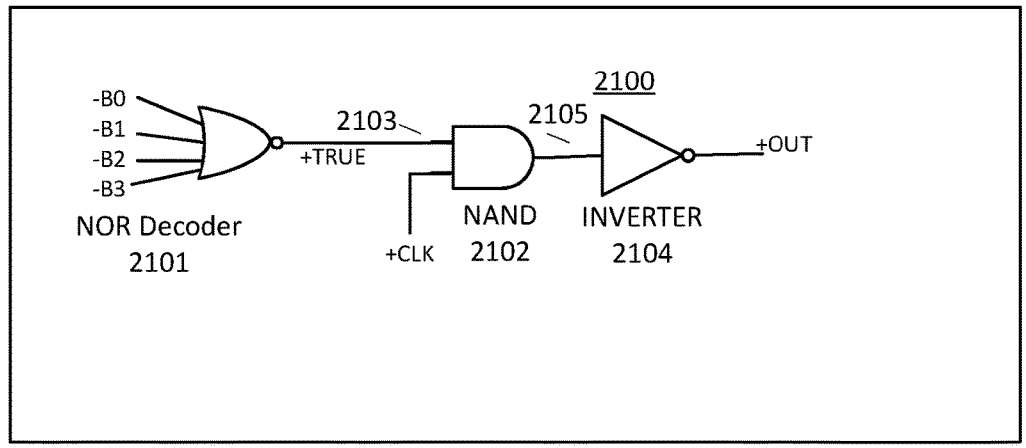
FIG. 21 depicts logic of a dynamic decode circuit.

Referring to FIG. 21, an embodiment of a dynamic decode circuit 2100 is depicted. During the evaluate state, when the clock (+CLK) is high (+) a NOR decoder 2101 produces a high signal (+TRUE) on a first interconnect 2103 when all the inputs –B0 –B1 –B2 and –B3 are low. During the evaluate stage, NAND 2102 produces a low output pulse on a second interconnect 2105 when the first interconnect is high and the +CLK is high. Inverter 2104 inverts the signal on the second interconnect to produce the high output pulse (+OUT) when the second interconnect is low. In this embodiment, the NOR 2101 and the NAND 2102 are precharged high when the +CLK is low and evaluated high when the +CLK is high.

Figure 25:
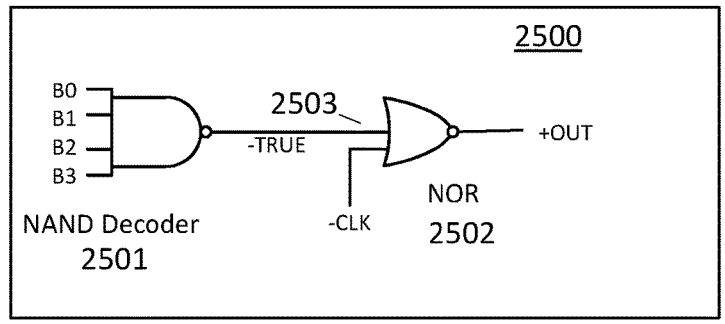
FIG. 25 depicts logic of a dynamic decode circuit.

Referring to FIG. 25, an embodiment of the new dynamic decode circuit 2550 is depicted. During an evaluate stage, when the clock (–CLK) is low (–) a NAND decoder 2551 produces a low signal (–TRUE) on an interconnect 2553 when all the inputs B0 B1 B2 and B3 are high. During the evaluate stage, an NOR 2552 produces a high output pulse (+OUT) when the interconnect 2553 is low and the –CLK is low. In this embodiment, the NAND 2551 and the NOR 2552 are precharged low when the –CLK is high and evaluated high when the –CLK is low.

Figure 22:
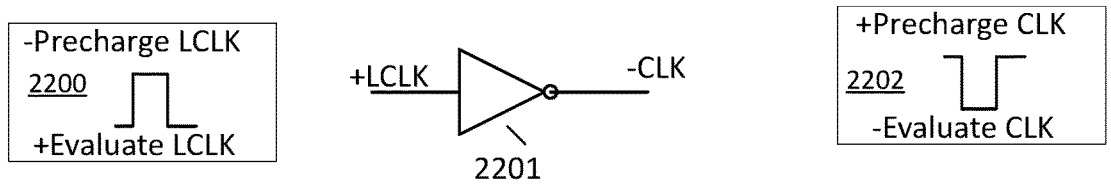
FIGS. 22-23 depict inverters for creating −CLK form +LCLK.

Referring to FIG. 22, the –CLK signal of the evaluate stage of dynamic decode circuit 2550 is produced by an inverter 2201 inverting the +LCLK (local clock) signal of the evaluate stage. Thus 2200 –precharge LCLK indicates a precharge phase when LCLK is low and +evaluate LCLK indicates an evaluate phase when LCLK is high and 2202 a +precharge CLK indicates the precharge phase when CLK is high and –evaluate CLK indicates the evaluate phase when CLK is low. The –CLK signal produced by the inverter 2201 may be used to clock a single dynamic decode circuit FIG.

20 2000, or multiple dynamic decode circuits 2000. In embodiments having a single inverter 2001 clocking multiple dynamic decode circuits 2000, the size and power of an associated clock buffer 1901 (FIG. 19) may be reduced since the capacitance load seen by the clock buffer 1901 is only that of the clock buffers.

Figure 23:
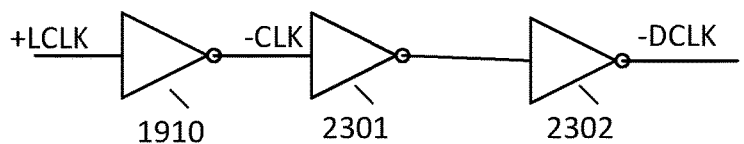

Referring to FIG. 23, the −CLK signal created by inverter 2201 is used to produce a delayed version (−DCLK) of the −CLK signal by receiving the −CLK signal from inverter 2201 and passing it through two inverters 2301 2302 to produce the delayed version −DCLK. The −CLK signal produced by the inverter 2201 may be used to clock a single dynamic decode circuit FIG. 20 2000, or multiple dynamic decode circuits 2000. In embodiments having a single inverter 2001 clocking multiple dynamic decode circuits 2000, the size and power of an associated clock buffer 1901 (FIG. 19) may be reduced since the capacitance load seen by the clock buffer 1901 is only that of the clock buffers. Furthermore, the −DCLK may be used by a plurality of dynamic decode circuits 2000 to reduce the number of inverters 2301 2302 needed to support an embodiment.

In an embodiment, the PSHARE node (FIG. 15) may be shared by a plurality of dynamic decode circuits 1500 (FIG. 15), each of the plurality of dynamic decode circuits has a transistor 1504 connected between the PSHARE node and the same power source. In another environment, each of the plurality of dynamic decode circuits share a single transistor 1504 connected between the PSHARE node and a power source.

Figure 24:
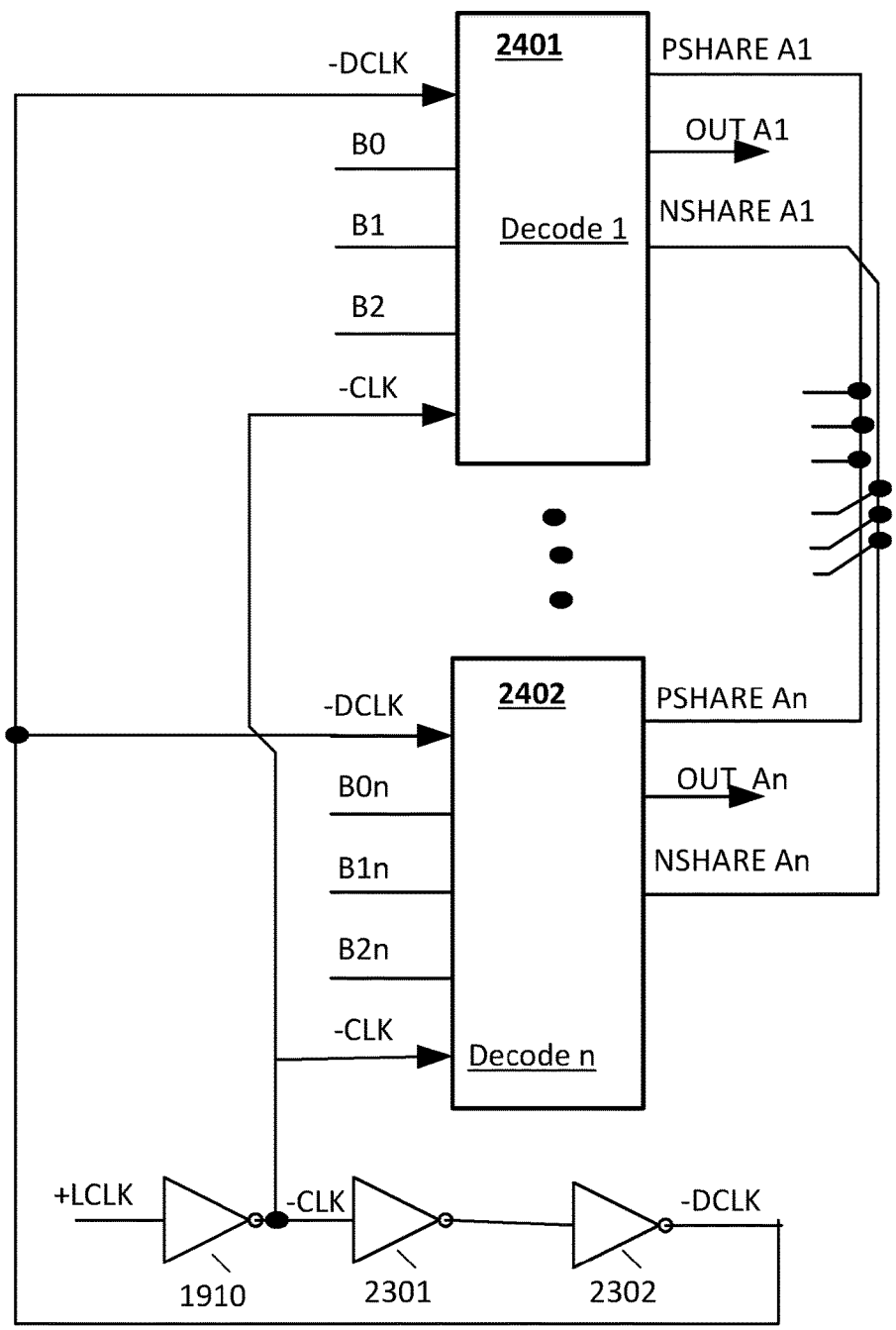
FIG. 24 depicts a plurality of new dynamic decode circuits sharing clocks.

Referring to FIG. 24 in an embodiment a plurality of dynamic decode circuits 2401 2402 share a common −CLK and a common −DCLK from a series of inverters 1910 2301 2302. Each dynamic decode circuit has its own set of inputs B0 B1 B2 B3 and its own output A. In an embodiment the plurality of dynamic decode circuits share an NSHARE node. In an embodiment the plurality of dynamic decode circuits share a PSHARE node.

The FinFET is a variation on traditional MOSFETs (bulk CMOS) distinguished by the presence of a thin silicon "fin" inversion channel on top of the substrate, allowing the gate to make two points of contact (the left and right sides of the fin). The thickness of the fin (measured in the direction from source to drain) determines the effective channel length of the device. The wrap-around gate structure provides a better electrical control over the channel and thus helps in reducing the leakage current and overcoming other short-channel effects. Multiple fins are possible as well as multiple gates, the gates are sometimes referred to as "fingers". The logic depicted in figures of the present specification depict nfet and pfet MOSFET technology in order to teach concepts. The concepts taught may also be utilized using nfet and pfet FinFET transistors or more complex FinFET logic circuits using multiple fins and multiple fingers.

In one example number of FINs of a FinFET circuit is a relative measure of size of transistors of the circuit. The relative measure of size may be indicative of relative sizes of bulk CMOS transistors in another embodiment. In one embodiment a FIN of a FET Gate may be 70 nm (nanometers) in length. Pfet and nfet transistors may be implemented in any of a number of technologies including, but not limited to bulk CMOS or FinFET technology.

TABLE 1

| LCBP (P/N FINS) | Cout (fF) | LCLK slew (ps/v) FIG. 15 vs FIG. 2 | SCLK-to-Out (ps)/slew FIG. 15 | SCLK-to-Out (ps)/slew FIG. 2 |
|---|---|---|---|---|
| S (20/12) | 5 | 27.6 vs >50 | 53.6 (18.8) | 61.3 (6.7) |
| M (30/18) | 5 | 21.6 vs 50.7 | 49.5 (18.8) | 56.2 (6.3) |
| L (56/36) | 5 | 14.6 vs 32.2 | 46.2 (18.8) | 48.8 (5.8) |
| XL (120/72) | 5 | 15.5 vs 22.1 | 44.5 (18.9) | 44.0 (5.8) |
| S (20/12) | 10 | 27.6 vs >50 | 60.2 (32.9) | 62.3 (8.1) |
| M (30/18) | 10 | 21.6 vs 50.7 | 56.0 (33.0) | 57.2 (7.5) |
| L (56/36) | 10 | 14.6 vs 32.2 | 52.7 (33.0) | 49.7 (7.1) |
| XL (120/72) | 10 | 15.5 vs 22.1 | 51.0 (33.1) | 44.9 (7.1) |

Figure 9:
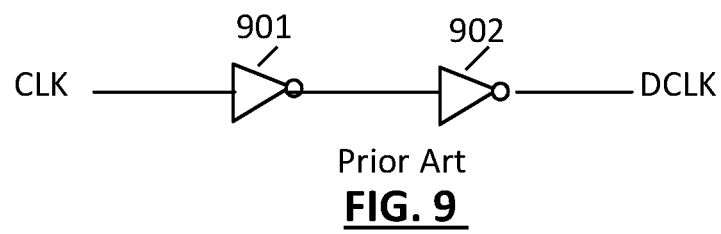
FIG. 9 depicts a prior art example of a circuit for creating a DCLK.

Table 1 depicts electrical characteristics showing advantage of an embodiment of the new Dynamic Decode circuit 1500 (FIG. 15) over an embodiment of previous Dynamic Decode circuits 250 (FIG. 2) in an embodiment having one LCBP clock Buffer and 16 Dynamic Decode circuits (FIG. 15), each new Dynamic Decode circuit having the 3 serial inverter clock generator 119 2301 2302 (FIG. 23) and each previous Dynamic Decode circuit having the 2 serial inverter clock generator 901 902 (FIG. 9). In column 1, various sized local clock buffers (LCBPs) 1901 are shown, S being the smallest having an output inverter with 20 pfet FINS and 12 nfet FINS (20/12), M having an output inverter with 30 pfet FINS and 18 nfet FINS pfet L having an output inverter with 56 pfet FINS and 36 nfet FINS and XL having an output inverter with 120 pfet FINS and 72 nfet FINS. It is well understood that size of support logic of the LCBP 1901 scales with size of the output inverter so, for example the circuits of the support logic of an S LCBP may be ⅓ the sized of that of an XL LCBP.

Example dynamic decode circuit output (NODE 2) loads are depicted in column 2, the first 4 being 5 femto Farads and the second 4 being 10 fempto Farads.

Column 3 shows example LCLK slew in picoseconds per volt (ps/v) of various sized clock buffers 1901 LCBPs.

Column 4 shows example overall clock slew in picoseconds per volt (ps/v) from the SCLK input of the clock buffer LCBP 1901 to OUT of the new Dynamic Decode circuit 1500 (FIG. 15) having −CLK, for various Cout loads and LCBP sizes.

Column 5 shows example overall clock slew in picoseconds per volt (ps/v) from the SCLK input of the clock buffer LCBP 1901 to OUT of the prior Dynamic Decode circuit 250 (FIG. 2) having +CLK, for various Cout loads and LCBP sizes.

Table 1 shows that the new Dynamic Decode circuit 1500 for all sized LCBPs may be substantially as fast as or faster than that of the prior example 250. This is for the case where each of the new Dynamic Decode circuits has a clock inverter 1910. Thus a designer may use a smaller LCBP clock buffer 1901 with the new Dynamic Decode circuit or may opt to share a clock inverter 1910 with multiple new dynamic decode circuits to reduce the size of the LCBP. Thus the new Dynamic Decoder circuit provides the designer with many power/performance/size tradeoffs not previously available.

Referring to FIG. 17, in an embodiment a dynamic logic circuit comprises a dynamic decode logic circuit 1700 comprising one or more nfet precharge circuits 1701 1702 1703 connected to a first power source (VSS), wherein each of the nfet precharge circuits comprises a first nfet precharge transistor 1701 1702 1703 (1511 1513 1517 FIG. 15) having a first nfet precharge gate configured to receive a negative active evaluation clock signal wherein the negative active evaluation clock signal is configured to be low during an evaluation phase; the dynamic decode logic circuit comprising one or more pfet evaluate transistors connected to a second power source, wherein each of the pfet evaluate transistors has a first pfet evaluation gate configured to receive the evaluation clock (−CLK) signal; the dynamic decode logic circuit comprising a decoder 1505 1506 1507 1508, wherein the decoder is configured to decode a plurality of inputs B0 B1 B2 B3 to pull a first node NODE 1 to a low state based on the plurality of inputs being in a predetermined state, wherein the decoder is configured to not pull the first node to the low state based on the plurality of inputs not being in the predetermined state; the dynamic decode logic circuit 1700 comprising an evaluation circuit 1520, the evaluation circuit consisting of a first nfet transistor 1516 serially connected to a first pfet transistor 1520 by a second node (NODE 2), wherein the first pfet transistor 1520 comprises a first pfet gate conductively connected to the first node (NODE 1), wherein the first nfet transistor 1516 comprises a first nfet gate conductively connected to the first node (NODE 1), wherein the first pfet transistor is connected to a pfet evaluate transistor 1514 by a pfet share (PSHARE) node, wherein a first nfet precharge circuit 1701 (1511) is configured to precharge the first node to the low state during a precharge phase of the negative active evaluation clock −CLK; and the dynamic decode logic circuit comprising a third node (NODE 3) of the decoder conductively connected to a pfet evaluate transistor 1514.

In an embodiment, the decoder comprises a plurality of pfet decoder transistors 1505 1506 1507 1508 connected in parallel between the first node and the third node, wherein each of the plurality of pfet decoder transistors has a respective gate connected to a respective input B0 B1 B2 B3.

In an embodiment, the dynamic decode logic circuit further comprises a plurality of serially connected nfet transistors 1501 1502 1503 1504, wherein the plurality of serially connected nfet transistors are disposed between the first power source and the first node, wherein each of the serially connected nfet transistors comprises a respective gate configured to receive a respective input signal from a respective input B0 B1 B2 B3.

In an embodiment, the dynamic decode logic circuit further comprises a pfet keeper transistor 1801 FIG. 18 connected between the first node (NODE 1) and the first power source VSS, wherein the second node (NODE 2) is conductively connected to a keeper gate of the pfet keeper transistor.

In an embodiment first nfet transistor 1516 is directly connected to the second power source.

In an embodiment FIG. 15, at least one of the plurality of nfet precharge circuits consists of two serially connected nfet transistors consisting of the first nfet precharge transistor 1511 1513 1517 and a second nfet precharge transistor 1510 1512 1518, wherein a second nfet precharge gate of the second nfet precharge transistor is configured to receive a delayed clock signal −DCLK, wherein the delayed clock signal is a delayed version of the negative active evaluation clock −CLK.

In an embodiment the dynamic decode circuit is configured to cause the second node to be high based on all the inputs B0 B1 B2 B3 being high and the negative active evaluation clock −CLK being low.

In an embodiment a second nfet precharge circuit 1517 1703 is configured to precharge the second node during the precharge phase of the negative active evaluation clock.

In an embodiment a third nfet precharge circuit 1517 1703 is configured to precharge the second node during the precharge phase of the negative active evaluation clock, wherein a fourth nfet precharge circuit 1513 1702 is configured to precharge the PSHARE node during the precharge phase of the negative active evaluation clock.

In an embodiment the PSHARE node PSHARE A1 (FIG. 24) is configured to be conductively connected to PSHARE nodes PSHARE An of one or more other dynamic decode circuits decode n, wherein the pfet evaluate transistor 1514 (FIG. 15) connected to the first pfet transistor 1515 of each dynamic decode circuit is a small pfet transistor, the small pfet transistor providing only a portion of current required to pull the PSHARE node of a plurality of dynamic decode circuits decode 1 to decode n to a high state.

In an embodiment the dynamic decode circuit is configured to produce a positive pulse FIG. 16 on the second node NODE 2 FIG. 15 based on the predetermined state being all inputs B0 B1 B2 B3 being in the high state, wherein start of the positive pulse OUT at time D is based on start of the evaluation phase CLK at time D, and end of the positive pulse OUT at time E is based on start of the precharge phase DCLK at time E.

In an embodiment the dynamic logic circuit further comprises a clock inverter 1910 FIG. 23, wherein the clock inverter creates the negative active evaluation clock from a positive active evaluation clock signal +LCLK, wherein the positive active evaluation clock signal is configured to be high during an evaluation phase.

In an embodiment the dynamic decode logic circuit is one of a plurality of dynamic decode logic circuits 2401 2402, wherein the clock inverter 1910 is configured to send the negative active evaluation clock −CLK to each dynamic decode logic circuit of the plurality of dynamic decode logic circuits.

In an embodiment the dynamic decode logic circuit further comprises a pfet precharged logic circuit, the pfet precharged logic circuit comprising one or more pfet precharge circuits 104 211 and 105 212 FIG. 2 connected to the second power source VDD, wherein each of the pfet precharge circuits comprises a respective first pfet precharge 104 105 transistor having a first pfet precharge gate configured to receive the positive active evaluation clock signal +LCLK; and one or more nfet evaluate transistors 219 213 connected to the first power source VSS, wherein each of the nfet evaluate transistors has a respective first nfet evaluation gate configured to receive the positive active evaluation clock signal +LCLK.

In an embodiment the dynamic decode logic circuit further comprises a local clock buffer, the local clock buffer 1901 FIG. 19 configured to create the positive active evaluation clock +LCLK signal from a system clock signal SCLK.

In an embodiment the dynamic decode logic circuit further comprises a clock inverter 1901 FIG. 23 and a plurality of delay clock inverters 2301 2302, wherein the clock inverter creates the negative active evaluation clock −CLK from a positive active evaluation clock signal +LCLK, wherein the plurality of delay clock inverters create the delayed clock signal −DLCK from the negative active evaluation clock −CLK of the clock inverter 1910.

In an embodiment the dynamic decode logic circuit is one of a plurality of dynamic decode logic circuits 2401 2402 FIG. 24, wherein the clock inverter 1901 is configured to send the negative active evaluation clock −CLK to each dynamic decode logic circuit 2401 2402 of the plurality of dynamic decode logic circuits.

In an embodiment the dynamic decode logic circuit further comprises a pfet precharged logic circuit 1903 FIG.

19, the pfet precharged logic circuit comprising: one or more pfet precharge circuits 1904 connected to the second power source, wherein each of the pfet precharge circuits comprises a first pfet precharge transistor 104 105 FIG. 2 having a first pfet precharge gate configured to receive the positive active evaluation clock signal +LCLK; and one or more nfet evaluate transistors 219 213 connected to the first power source VSS, wherein each of the nfet evaluate transistors has a first nfet evaluation gate configured to receive the positive active evaluation clock signal +LCLK.

In an embodiment having only one evaluate transistor, the pfet evaluate transistor 1514 FIG. 15 connected to the first pfet transistor 1515 is the pfet evaluate transistor connected to the PSHARE node wherein NODE 3 and the PSHARE node are the same node.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for decoding a plurality of inputs of a dynamic decode logic circuit of a dynamic logic circuit to produce an output, wherein the dynamic decode logic circuit comprises a decoder connected by a first node to an evaluation circuit, wherein the evaluation circuit is connected to a second node (OUT), wherein the dynamic decode logic circuit utilizes a negative active evaluation clock signal, wherein the negative active evaluation clock signal is high during a precharge phase, wherein the negative active evaluation clock signal is low during an evaluate phase, the method comprising:
receiving the negative active evaluation clock signal, by a first nfet precharge circuit connected between a first power source and the first node of the decoder;
receiving the negative active evaluation clock signal, by a first pfet evaluate transistor connected between a second power source and a third node of the decoder;
precharging one or more nodes of the dynamic decode logic circuit, the precharging comprising precharging the first node low, by the first nfet precharge circuit, based on the received negative active evaluation clock signal being high;
causing the third node to be high, by the first pfet evaluate transistor, based on the received negative active evaluation clock signal being low;
decoding the plurality of inputs, by the decoder, the decoding comprising based on the third node being high and the plurality of inputs not being in the predetermined state, causing, by the decoder, the first node to be high; and
performing, by dynamic decode logic circuit, any one of:
based on the first node being high, causing the second node to be low, by the evaluation circuit, during the evaluation phase; and
based on the first node being low and, causing, the second node to be high, by the evaluation circuit, during the evaluation phase.

2. The method according to claim 1, wherein the decoding further comprises, based on the third node being high and the plurality of inputs being in the predetermined state, not causing, by the decoder, the first node to be high.

3. The method according to claim 1, wherein all of the plurality of inputs being high is the predetermined state.

4. The method according to claim 2, wherein the method further comprises pulling the first node low, by a series of nfet transistors, based on the inputs being in the predetermined state.

5. The method according to claim 2, wherein the method further comprises pulling the first node low, by a pfet keeper transistor, based on the second node being high.

6. The method according to claim 1, wherein the method further comprises:
creating a delayed clock signal, wherein the delayed clock signal is a delayed version of the negative active evaluation clock signal; and
precharging the one or more nodes based on the negative active evaluation clock signal being high and the delayed clock signal being high.

7. The method according to claim 1, wherein the method further comprises causing the second node to be low, by a second nfet precharge circuit, based on a received negative active evaluation clock signal being high.

8. The method according to claim 1, wherein the method further comprises:
causing the second node to be low, by a second nfet precharge circuit, based on the negative active evaluation clock signal being high; and
causing an interconnection (PSHARE) node between the evaluation circuit and a pfet evaluate transistor to be low, by a third nfet precharge circuit, based on the negative active evaluation clock signal being high.

9. The method according to claim 1, wherein the method further comprises providing, by an evaluate transistor, only a portion of current required to pull an interconnection (PSHARE) node between the evaluation circuit and a pfet evaluate transistor high.

10. The method according to claim 1, wherein the method further comprises producing, by the dynamic decode circuit, a positive pulse on the second node based on the predetermined state being all inputs being in the high state, wherein start of the positive pulse is based on start of the evaluation phase, and end of the positive pulse is based on start of the precharge phase.

11. The method according to claim 1, wherein the method further comprises creating, by a clock inverter, the negative active evaluation clock signal from a positive active evaluation clock signal, wherein the positive active evaluation clock signal is configured to be high during the evaluation phase, wherein the positive active evaluation clock signal is configured to be low during the precharge phase.

12. The method according to claim 11, wherein the method further comprises sending, by the clock inverter, the negative active evaluation clock signal to each dynamic decode logic circuit of a plurality of dynamic decode logic circuits of the dynamic logic circuit.

13. The method according to claim 11, wherein the method further comprises:
receiving the positive active evaluation clock signal, by one or more pfet precharged logic circuits, each pfet precharged logic circuit comprising one or more pfet precharge circuits connected to the second power source; and
receiving the positive active evaluation clock signal, by each first nfet evaluate transistor of the one or more pfet precharged logic circuits.

14. The method according to claim 13, wherein the method further comprises creating by a local clock buffer of the dynamic logic circuit, the positive active evaluation clock signal from a system clock signal.

15. The method according to claim 1, wherein the method further comprises receiving, by each decoder transistor of the decoder, a respective input of the plurality of inputs, wherein each decoder transistor is connected between the first node and the third node.

16. The method according to claim 6, wherein the method further comprises:
  creating, by a clock inverter, the negative active evaluation clock signal from a positive active evaluation clock signal; and
  creating, by a plurality of delay clock inverters, the delayed clock signal from the negative active evaluation clock signal of the clock inverter.

17. The dynamic logic circuit according to claim 16, wherein the method further comprises sending, by the clock inverter, the negative active evaluation clock signal to each dynamic decode logic circuit of a plurality of dynamic decode logic circuits.

18. The method according to claim 1, wherein the method further comprises pulling an interconnection (PSHARE) node between the evaluation circuit and a pfet evaluate transistor positive, by a second pfet evaluate transistor, based on the negative active evaluation clock signal being low.

19. The method according to claim 1, wherein the method further comprises causing the third node to be low, by a third nfet precharge circuit, based on the received negative active evaluation clock signal being high.

20. The method according to claim 1, wherein the method further comprises pulling an interconnection (PSHARE) node between the evaluation circuit and a pfet evaluate transistor positive, by the first evaluate transistor, based on the negative active evaluation clock signal being low.

* * * * *